United States Patent
Hayashi et al.

(10) Patent No.: US 8,508,031 B2
(45) Date of Patent: Aug. 13, 2013

(54) ELECTRONIC DEVICE AND METHOD OF PRODUCING THE SAME

(75) Inventors: Nobuyuki Hayashi, Kawasaki (JP); Yasuhiro Yoneda, Kawasaki (JP); Teru Nakanishi, Kawasaki (JP); Masaru Morita, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 144 days.

(21) Appl. No.: 12/907,304

(22) Filed: Oct. 19, 2010

(65) Prior Publication Data
US 2011/0147918 A1    Jun. 23, 2011

(30) Foreign Application Priority Data
Dec. 18, 2009 (JP) .................. 2009-287361

(51) Int. Cl.
*H01L 23/48* (2006.01)
*H01L 21/00* (2006.01)

(52) U.S. Cl.
USPC .......... 257/688; 257/738; 257/E21.499; 257/E23.001; 438/106; 438/108; 438/613

(58) Field of Classification Search
USPC ............ 438/106, 108, 613; 257/688, 738, 257/E21.499, E23.001
See application file for complete search history.

(56) References Cited

U.S. PATENT DOCUMENTS

| | | | |
|---|---|---|---|
| 6,518,666 B1* | 2/2003 | Ikeda | 257/738 |
| 7,518,235 B2 | 4/2009 | Coico et al. | 257/719 |
| 2004/0084764 A1 | 5/2004 | Ishimine | |
| 2008/0047137 A1* | 2/2008 | Asahi et al. | 29/876 |
| 2011/0134606 A1* | 6/2011 | Gallarelli et al. | 361/679.54 |

FOREIGN PATENT DOCUMENTS

| | | |
|---|---|---|
| JP | 2000-332473 | 11/2000 |
| JP | 3183278 | 7/2001 |
| JP | 2004-165586 A1 | 6/2004 |
| JP | 2008-28011 | 2/2008 |

OTHER PUBLICATIONS

Office Action dated Aug. 30, 2012 issued in corresponding Chinese Patent Application No. 201010597536.8 with English translation.
Chinese Office Action dated Mar. 27, 2013, with English Translation, in counterpart Chinese Application No. 201010597536.8.

* cited by examiner

*Primary Examiner* — Michelle Mandala
(74) *Attorney, Agent, or Firm* — Kratz, Quintos & Hanson, LLP

(57) ABSTRACT

An electronic device includes a wiring board; a semiconductor device arranged at an upper side of the wiring board with an electrically conductive member being arranged therebetween; a covering member arranged at an upper side of the semiconductor device; and a supporting member arranged at a lower side of the wiring board, the supporting member having a convex portion facing the wiring board, the supporting member being connected to the covering member and supporting the wiring board at the convex portion.

14 Claims, 20 Drawing Sheets

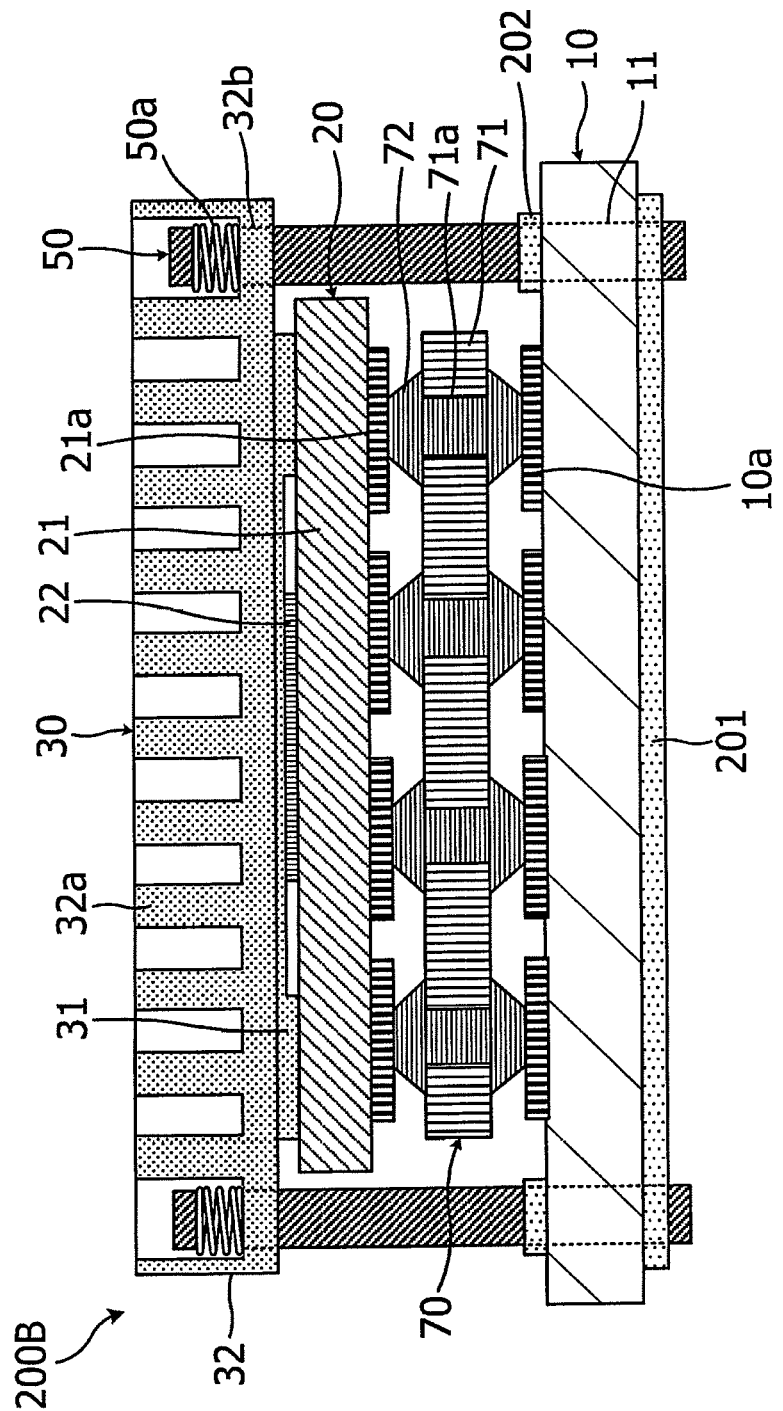

US 8,508,031 B2

ELECTRONIC DEVICE AND METHOD OF PRODUCING THE SAME

CROSS-REFERENCE TO RELATED APPLICATION

This application is based upon and claims the benefit of priority of the prior Japanese Patent Application No. 2009-287361, filed on Dec. 18, 2009, the entire contents of which are incorporated herein by reference.

FIELD

The present disclosure generally relates to an electronic device and a method for producing the same.

BACKGROUND

For an electronic equipment, an electronic device having a semiconductor device (semiconductor package) and a wiring board having the semiconductor device mounted thereto is widely used. The semiconductor device includes a semiconductor element (semiconductor chip). In recent years, in order to reduce the size and weight and enhance the performance of an electronic equipment, a surface-mount type (such as, a ball grid array (BGA) type or a land grid array (LGA) type), which allows a reduction of a mount area and high-density mounting, is widely used in semiconductor devices included in electronic devices. The electronic devices may be provided with a heat-dissipating member for dissipating heat generated at the semiconductor device.

Various structures of the above-described electronic devices have been hitherto proposed. For example, a structure in which a wiring board and a semiconductor device (mounted to the wiring board) are coupled to a reinforcement lead is known (see, for example, Japanese Patent No. 3183278). In addition, a structure in which a heat-dissipating member thermally coupled to a semiconductor device (mounted to a wiring board) is coupled to the wiring board is known (see, for example, Japanese Laid-open Patent Application Publication No. 2000-332473). Further, a method in which a supporting member is provided at a side of a wiring board opposite to a semiconductor-device-mounting-surface side; predetermined components arranged at a side of, for example, a heat-dissipating member facing the semiconductor-device-mounting-surface side of the wiring board being coupled to the supporting member; and the wiring board and the semiconductor device being secured to each other are also known (see, for example, Japanese Laid-open Patent Application Publication No. 2004-165586).

SUMMARY

According to an aspect of an embodiment of the present invention, an electronic device comprising: a wiring board; a semiconductor device arranged at an upper side of the wiring board with an electrically conductive member being arranged therebetween; a covering member arranged at an upper side of the semiconductor device; and a supporting member arranged at a lower side of the wiring board, the supporting member having a convex portion facing the wiring board, the supporting member being connected to the covering member and supporting the wiring board at the convex portion.

According to another aspect of the embodiment of the present invention, a method of producing an electronic device comprising: arranging a semiconductor device at an upper side of a wiring board with an electrically conductive member being arranged therebetween; arranging a covering member at an upper side of the semiconductor device; and coupling the covering member to a supporting member and supporting the wiring board at a convex portion, the supporting member being arranged at a lower side of the wiring board and having the convex portion facing the wiring board.

The object and advantages of the invention will be realized and attained by means of the elements and combinations particularly recited in the claims.

It is to be understood that both the foregoing general description and the following detailed description are exemplary and explanatory and are not restrictive of the invention, as claimed.

BRIEF DESCRIPTION OF THE DRAWINGS

FIGS. 9A and 9B are sectional views of another exemplary electronic device using a flat supporting member (second example);

DESCRIPTION OF EMBODIMENTS

First, a first embodiment of the present invention will be described.

Figure 1:
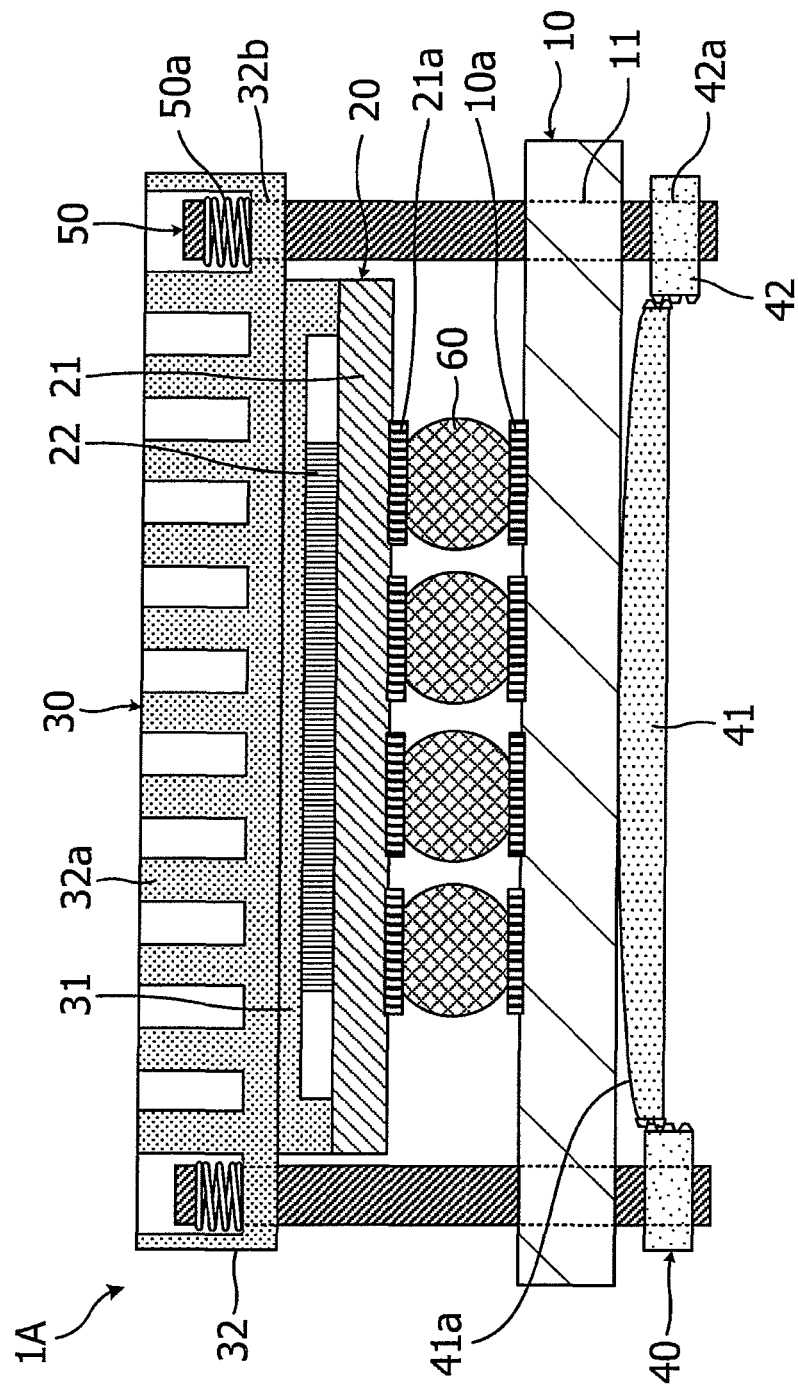
FIG. 1 is a sectional view of an exemplary electronic device according to a first embodiment of the present invention.
Figure 2:
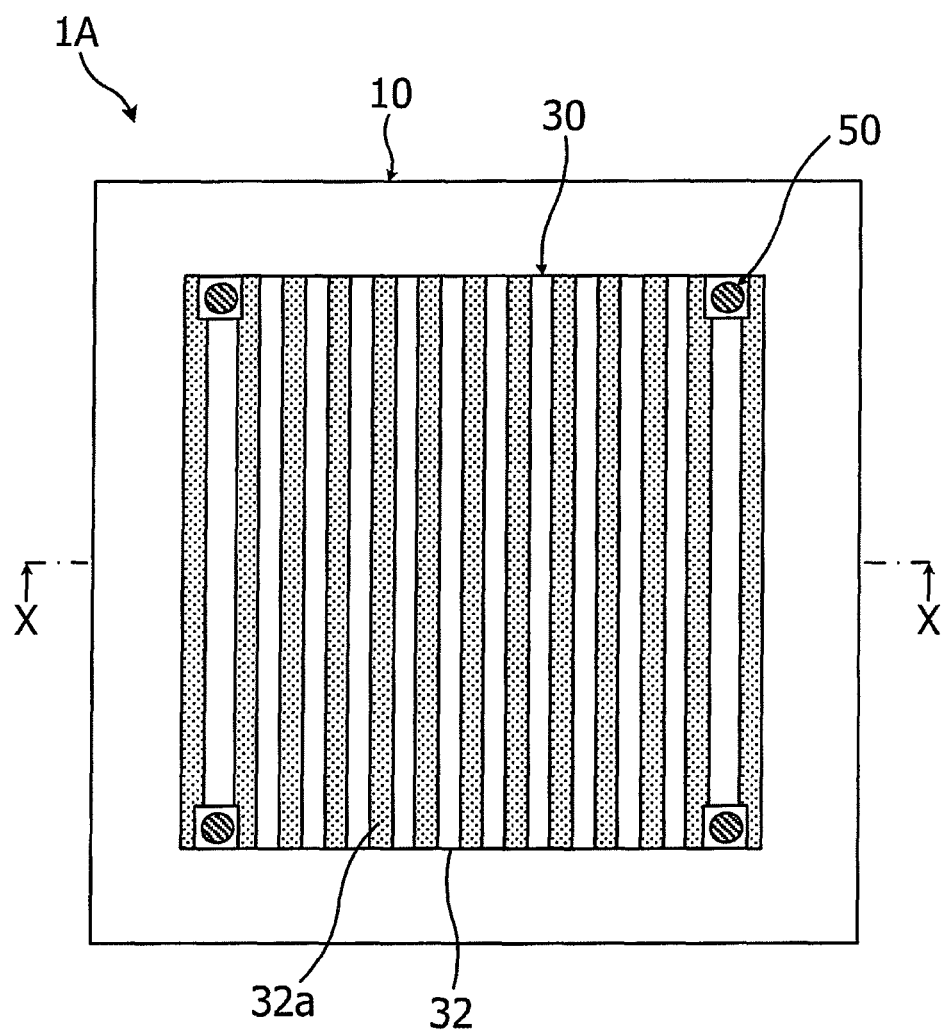
FIG. 2 is a plan view of the exemplary electronic device according to the first embodiment.
Figure 3:
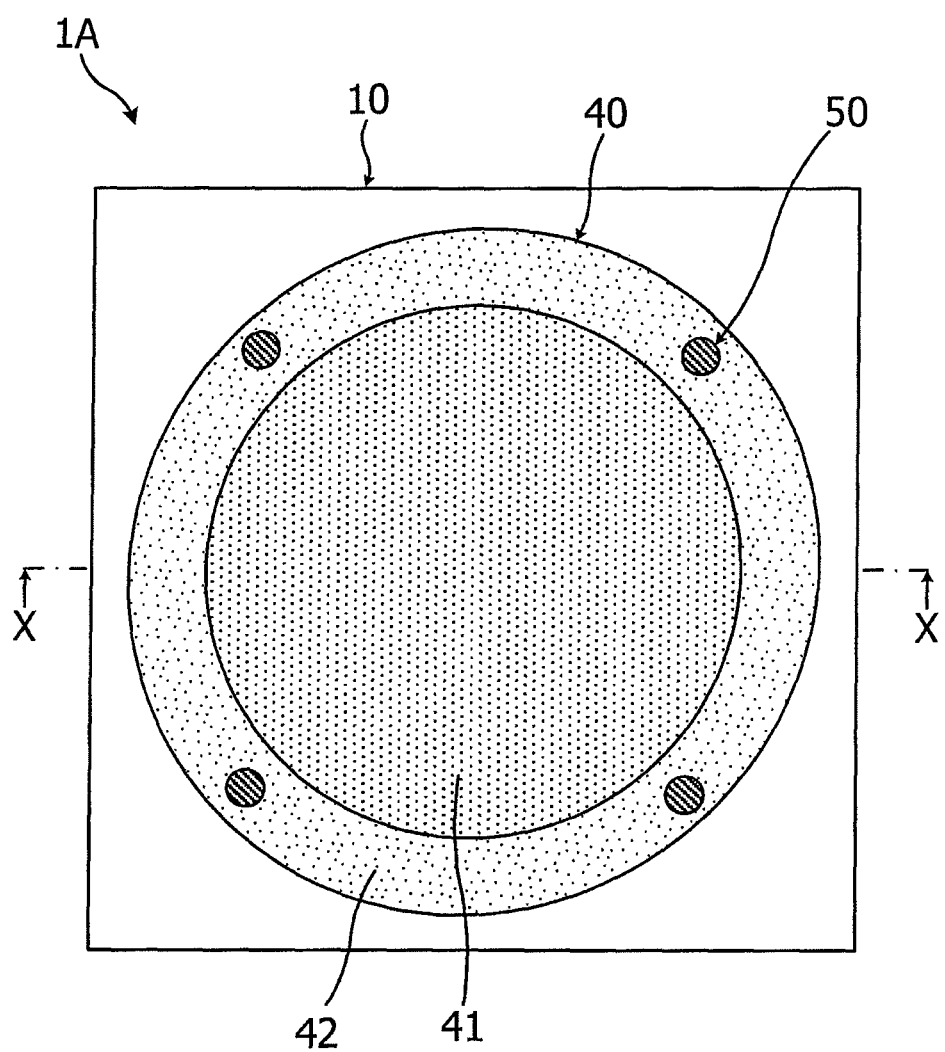
FIG. 3 is a bottom view of the exemplary electronic device according to the first embodiment.

FIG. 1 is a sectional view of an exemplary electronic device according to the first embodiment. FIG. 2 is a plan view of the exemplary electronic device according to the first embodiment. FIG. 3 is a bottom view of the exemplary electronic device according to the first embodiment. FIG. 1 is a sectional view taken along lines X-X of FIGS. 2 and 3.

The electronic device 1A includes a wiring board 10, a semiconductor package (semiconductor device) 20, a heat-dissipating member 30, a supporting member 40, and spring provided screws 50.

As illustrated in FIG. 1, a plurality of electrodes 10a (four in the embodiment) are formed at one surface (front surface) of the wiring board 10. In addition, as illustrated in FIGS. 1 to 3, through holes 11 configured to receive the respective spring provided screws 50 (four screws 50 in the embodiment) are formed in the wiring board 10. The electrodes 10a are provided at a central portion of the wiring board 10. The through holes 11 are provided in end portions (here, the four end portions) of the wiring board 10.

Although not illustrated, each electrode 10a at the wiring board 10 is electrically coupled to an electrically conductive pattern (wire) provided on the front surface of the wiring board 10, and/or an electrically conductive pattern (wire and via) provided in the wiring board 10. A printed wiring board including a base material (such as, glass fiber) and resin (such as, polyimide or epoxy resin) as an insulating layer, and having an electrically conductive pattern formed on the front surface and/or the inside may be used as the wiring board 10. The pattern has a predetermined shape and position.

As illustrated in FIG. 1, the semiconductor package 20 includes a package substrate 21 and a semiconductor element 22 mounted to the package substrate 21. The semiconductor element 22 is electrically coupled (mounted) to the package substrate 21 by, for example, flip chip bonding.

As illustrated in FIG. 1, a plurality of electrodes 21a (four in the embodiment) are provided at one surface of the package substrate 21 (at a side opposite to a side where the semiconductor element 22 is mounted) at positions corresponding to the positions of the electrodes 10a at the wiring board 10. Although not illustrated here, each electrode 21a is electrically coupled to an electrically conductive pattern (wire and via) provided in the package substrate 21, and to the semiconductor element 22 mounted to the other surface of the package substrate 21. For example, a substrate including, for example, resin, glass, ceramic, or glass ceramic as an insulating layer, and having an electrically conductive pattern formed in the inside may be used as the package substrate 21. The pattern has a predetermined shape and position.

As illustrated in FIG. 1, the wiring board 10 and the semiconductor package 20 are electrically coupled to each other by bumps 60, provided between the electrodes 10a and the electrodes 21a (arranged in correspondence with the electrodes 10a). Here, ball bumps, formed of metal (such as, solder), are used as the bumps 60.

As illustrated in FIGS. 1 and 2, the heat-dissipating member 30 is provided at the upper side of the semiconductor package 20 (that is, at a side opposite to the wiring board 10). The heat-dissipating member 30 includes a heat spreader 31 and a heat sink 32 including a plurality of fins 32a. The heat spreader 31 is provided so as to cover the upper side and sides of the semiconductor element 22 of the semiconductor package 20. Through holes 32b for receiving the spring provided screws 50 are provided at end portions of the heat sink 32 (here, the end portions at the four corners).

The heat spreader 31 is thermally coupled to the semiconductor package 20. The heat sink 32 is thermally coupled to the heat spreader 31. By directly contacting the semiconductor package 20 and the heat spreader 31 with each other and the heat spreader 31 and the heat sink 32 with each other, it is possible to thermally connect the semiconductor package 20 and the heat spreader 31 with each other and the heat spreader 31 and the heat sink 32 with each other. Alternatively, by providing, for example, an adhesive having a constant thermal conductivity or thermal grease (not illustrated) between the semiconductor package 20 and the heat spreader 31 and between the heat spreader 31 and the heat sink 32, it is possible to thermally connect the semiconductor package 20 and the heat spreader 31 with each other, and the heat spreader 31 and the heat sink 32 with each other.

As illustrated in FIGS. 1 and 3, the supporting member 40 is arranged at a side of a surface of the wiring board 10 opposite to a semiconductor-package-20 side (that is, at a side of a back surface of the wiring board 10).

Figure 4A:
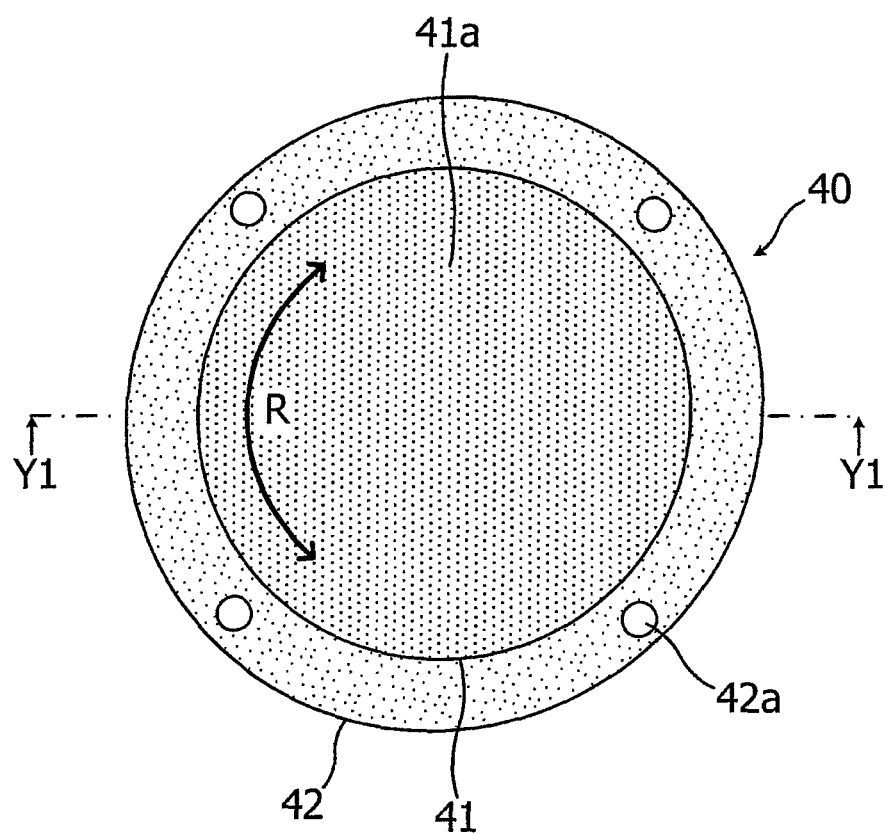
FIGS. 4A and 4B illustrate an exemplary supporting member used in the exemplary electronic device according to the first embodiment.
Figure 4B:
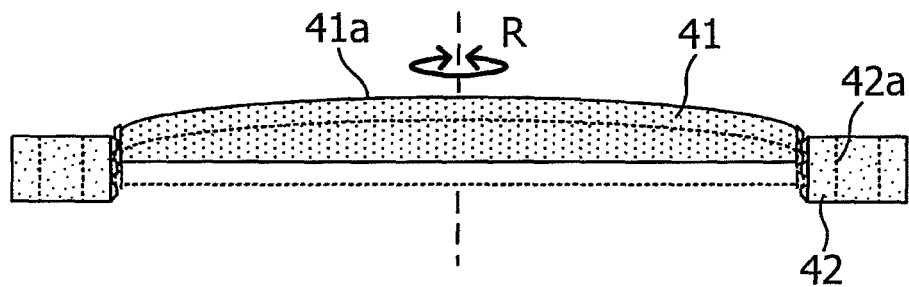

Here, FIGS. 4A and 4B illustrate an exemplary supporting member 40 used in the electronic device according to the first embodiment of the present invention. FIG. 4A is a plan view, and FIG. 4B is a sectional view taken along line Y1-Y1 of FIG. 4A.

The supporting member 40 includes a first supporting section 41 and a second supporting section 42.

The first supporting section 41 has a convex surface 41a that is curved in a convex form towards the wiring board 10. The second supporting section 42 has a circular ring shape in plan view and is provided around the first supporting section 41. The second supporting section 42 has threaded holes 42a into which are screwed the spring provided screws 50 inserted in the through holes 11 of the wiring board 10 and the through holes 32b of the heat sink 32.

The first supporting section 41 is screwed into the second supporting section 42. By rotating the first supporting section 41 in the directions labelled R and represented in double-headed thick arrows as illustrated in FIGS. 4A and 4B, the first supporting section 41 is raised and lowered with respect to the second supporting section 42. By screwing the first supporting section 41 into the second supporting section 42, and rotating it, the first supporting section 41 can be continuously raised or lowered in a single step.

As illustrated in FIGS. 1 and 3, in the electronic device 1A, the first supporting section 41 of the supporting member 40 is arranged at a central portion of the back surface of the wiring board 10 (that is, at an area at the back surface side in correspondence with a semiconductor-package-20 mounting area at a front surface side). The central portion of the back surface of the wiring board 10 is supported by the convex surface 41a of the first supporting section 41.

For example, the electronic device 1A having the above-described structure can be assembled as follows.

First, the semiconductor package 20 is mounted to the central portion of a front surface of the wiring board 10. For example, the bumps 60 are mounted to the respective electrodes 21a of the semiconductor package 20; and the semiconductor package 20 is aligned with the electrodes 21a and electrodes 10a and is arranged at the upper side of the wiring board 10. Thereafter, the bumps 60 are formed into a molten form by heat treatment or are bonded by thermal compression to the electrodes 10a, so that the wiring board 10 and the semiconductor package 20 are electrically coupled to each other by the bumps 60.

After mounting the semiconductor package 20 to the wiring board 10, the heat spreader 31 and the heat sink 32 of the heat-dissipating member 30 are thermally coupled to the semiconductor package 20. Then, the spring provided screws 50 are inserted into the through holes 32b of the heat sink 32 and the through holes 11 of the wiring board 10, and are screwed into threaded holes 42a of the supporting member 40 arranged at the back surface of the wiring board 10.

One end (head) side of each spring provided screw 50 is engaged and stopped at the heat sink 32 by a spring 50a. The other end side (shaft front end portion) thereof is screwed into its corresponding threaded hole 42a of the second supporting section 42. This causes the heat-dissipating member 30 and the supporting member 40 to be coupled to each other with the spring provided screws 50.

During the connection, the spring provided screws 50 are screwed into the threaded holes 42a of the second supporting section 42 from the front ends to a predetermined location. Then, the first supporting section 41 is rotated and raised towards the wiring board 10. Consequently, while the central portion of the back surface of the wiring board 10 having the semiconductor package 20 mounted at the central portion of its front surface is supported by the convex surface 41a, the wiring board 10 is pushed towards the heat-dissipating member 30. When the wiring board 10 is pushed towards the heat-dissipating member 30, the wiring board 10 is guided by the spring provided screws 50 inserted into the through holes 11.

Accordingly, in the electronic device 1A, the central portion of the back surface of the wiring board 10 having the semiconductor package 20 mounted to the central portion of its front surface is supported by the convex surface 41a of the first supporting section 41 of the supporting member 40, and the wiring board 10 is secured between the supporting member 40; and the heat-dissipating member 30. At this time, by supporting the central portion of the back surface of the wiring board 10 by the convex surface 41a of the first supporting section 41, the wiring board 10 is secured while being suspended from the second supporting section 42. In the electronic device 1A, the wiring board 10 is not restrained at the through holes 11 in which the spring provided screws 50 are inserted.

When the semiconductor package 20 is mounted to the wiring board 10 by, for example, the aforementioned heat treatment, the wiring board 10 may become deformed (curved) prior to assembling the electronic device 1A. Such deformation occurs due to, for example, manufacturing process conditions (such as, the type of material used in the wiring board 10, the place where an electrically conductive pattern is arranged in the wiring board 10, arrangement density, and heat-treatment temperature).

Figure 5:
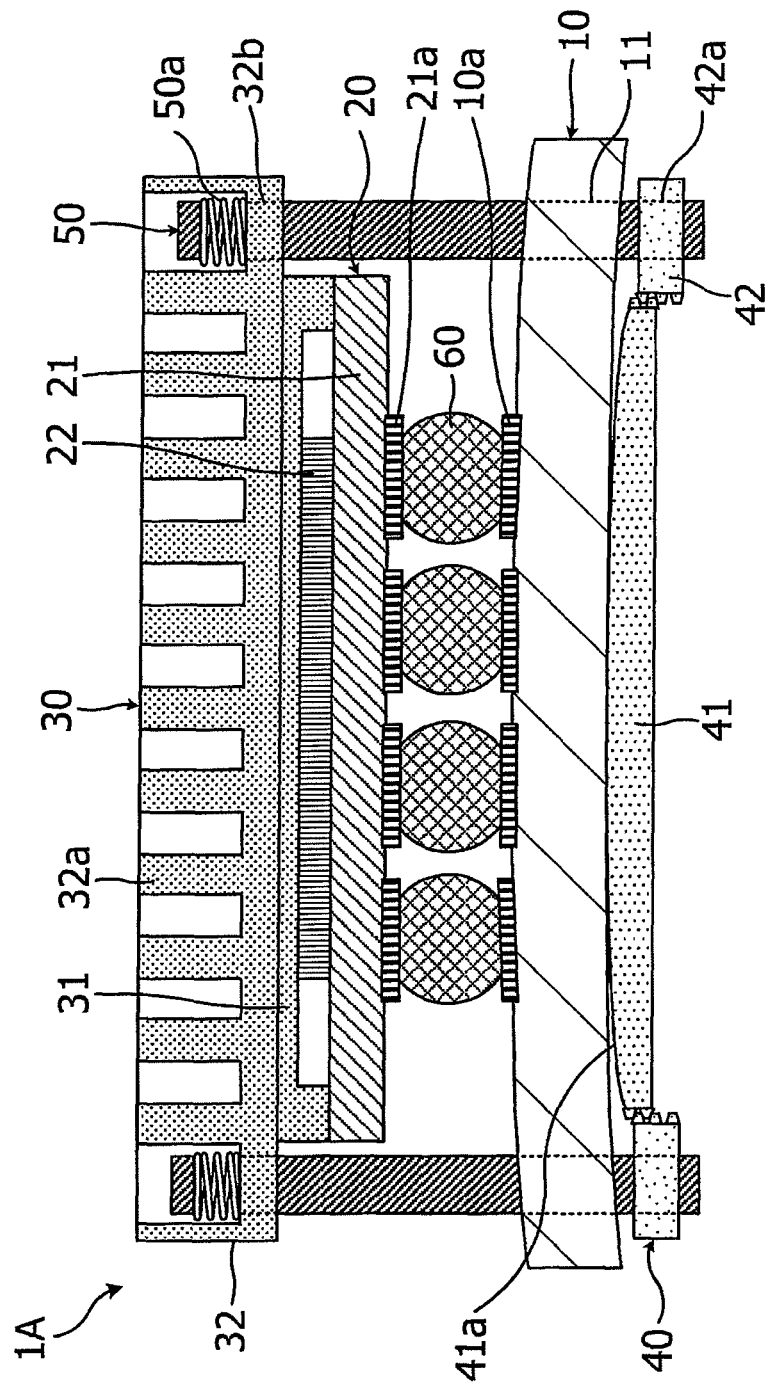
FIG. 5 illustrates a case in which a wiring board of the electronic device according to the first embodiment is deformed.

FIG. 5 illustrates a case in which the wiring board of the electronic device according to the first embodiment is deformed.

For example, as illustrated in FIG. 5, it is assumed that the wiring board 10 having the semiconductor package 20 mounted thereto is curved in a convex form towards the semiconductor package 20.

The electronic device 1A can be assembled using such a deformed wiring board 10 similarly to when the electronic device 1A is assembled using the aforementioned flat wiring board 10 illustrated in FIG. 1. That is, the heat-dissipating member 30 (the heat spreader 31 and the heat sink 32) is thermally coupled to the semiconductor package 20 that is mounted to the central portion of the front surface of the deformed wiring board 10. Thereafter, the heat-dissipating member 30 and the supporting member 40 are coupled to the spring provided screws 50. By raising the first supporting section 41 of the supporting member 40, the wiring board 10 is pushed towards the heat-dissipating member 30 while the central portion of the back surface of the wiring board 10 is supported by the convex surface 41a.

Accordingly, in the electronic device 1A, similar to when the aforementioned flat wiring board 10 is used, when the wiring board 10 that is not flat and that has the semiconductor package 20 mounted thereto is used, the wiring board 10 can be secured between the heat-dissipating member 30 and the supporting member 40 while the wiring board 10 is supported by the convex surface 41a of the first supporting section 41.

In addition to when mounting the semiconductor package 20 to the wiring board 10, the wiring board 10 may be deformed after mounting the semiconductor package 20 to the wiring board 10 or even after assembling the electronic device 1A using this method.

When the assembled electronic device 1A operates, the semiconductor package 20 generates heat. For example, as the semiconductor package 20 generates heat, a heat load is applied to the wiring board 10, thereby deforming the wiring board 10. The deformation of the wiring board 10 caused by the heat load during the operation of the electronic device 1A occurs even from the flat state of the wiring board 10 as illustrated in FIG. 1 or from the deformed state of the wiring board 10 as illustrated in FIG. 5.

In the electronic device 1A, when the wiring board 10 is deformed by the heat load during the operation of the electronic device 1A, since the wiring board 10 is supported by the convex surface 41a of the supporting member 40, the wiring board 10 is deformed with a portion of the wiring board 10 that is supported by the convex surface 41a being a fulcrum.

Accordingly, in the electronic device 1A, when the flat or deformed wiring board 10 is supported by the convex surface 41a of the supporting member 40, and when the heat load is applied to the wiring board 10 during the operation of the electronic device 1A, the wiring board 10 is deformed with a portion of the wiring board 10 supported by the convex surface 41a being a fulcrum. Therefore, in the electronic device 1A, electrical connection between the wiring board 10 and the semiconductor package 20 is effectively maintained. This point will hereunder be further described.

First, for a comparison with the electronic device 1A, an electronic device including a flat supporting member not having a convex surface 41a will be described.

Figure 6A:
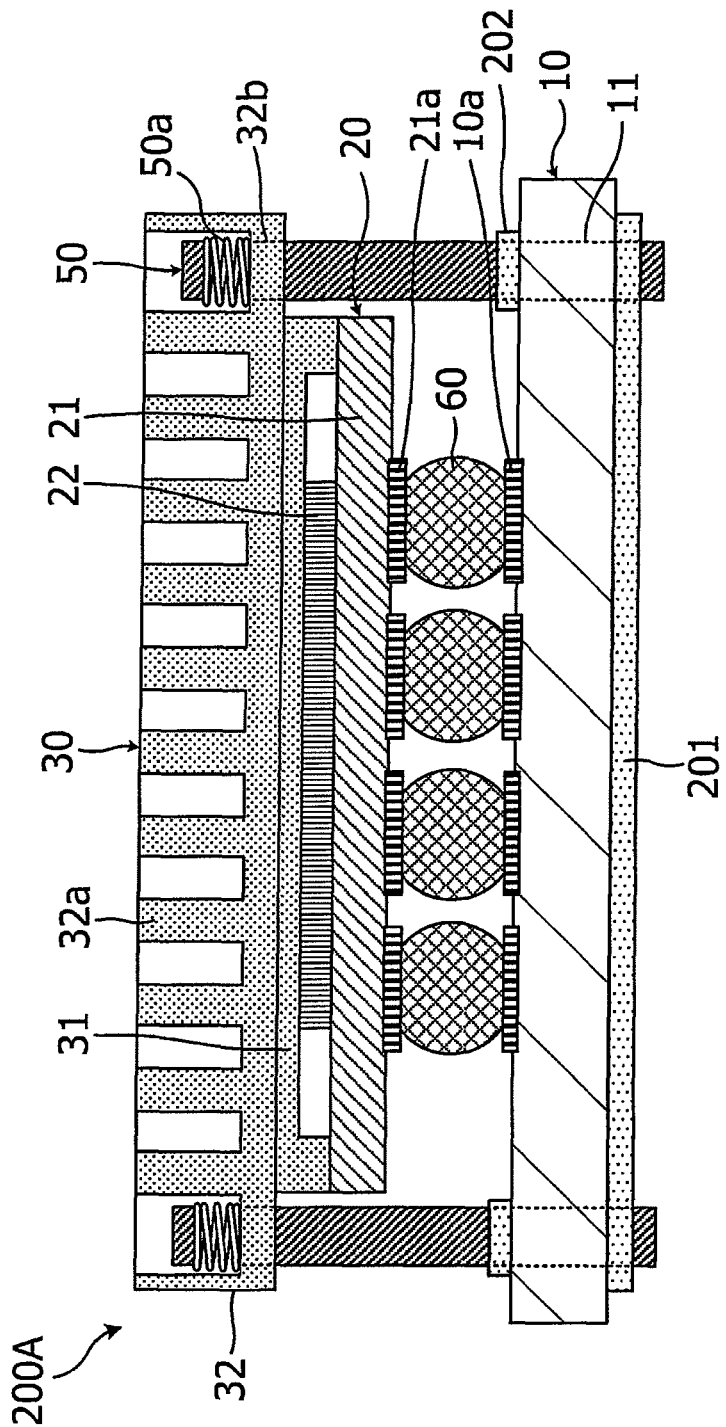
FIGS. 6A and 6B are sectional views of an exemplary electronic device using a flat supporting member (first example)
Figure 6B:
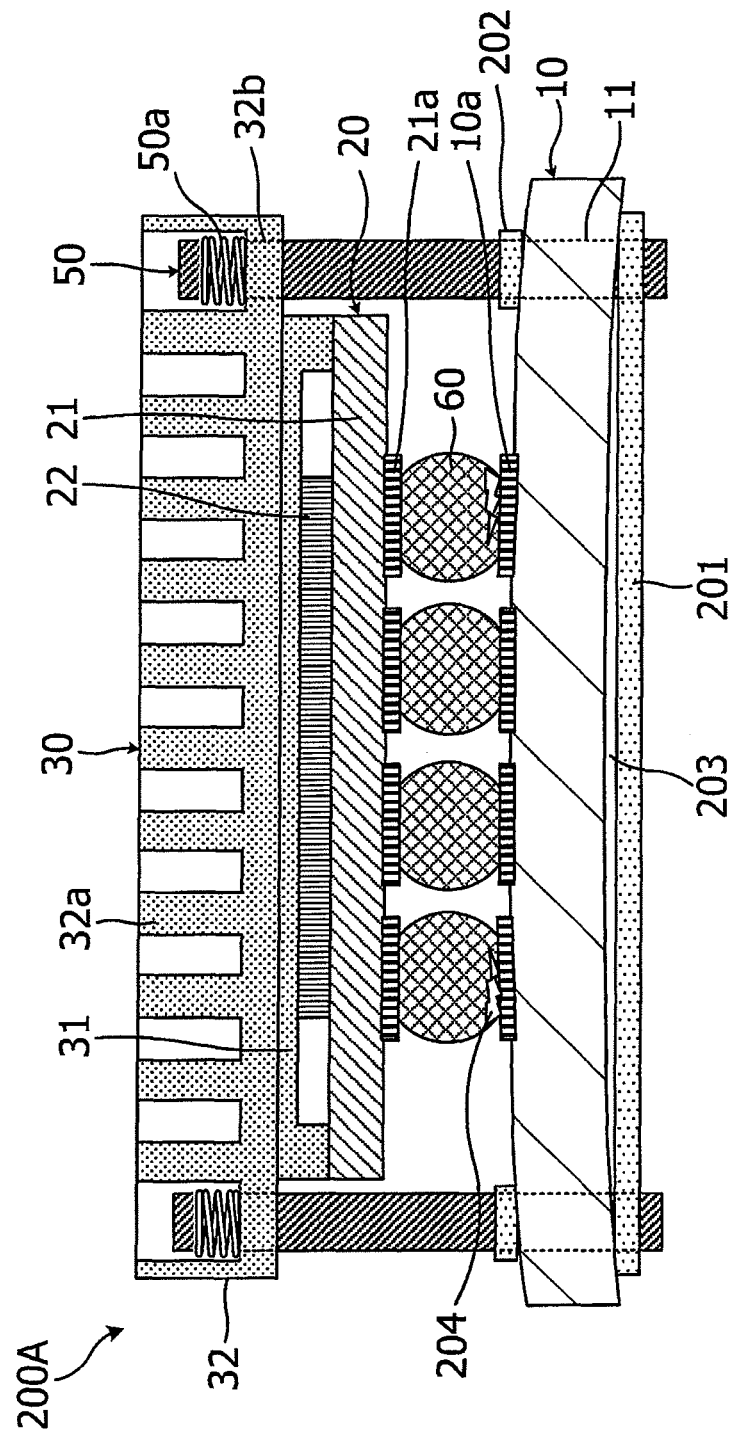

FIG. 6A is a sectional view of an exemplary electronic device 200A using a flat supporting member 201. FIG. 6B illustrates a case in which a wiring board 10 of the electronic device 200A using the flat supporting member 201 is deformed.

FIG. 6A illustrates the electronic device 200A in which the wiring board 10 is supported by the flat supporting member 201. Here, a case in which the wiring board 10 is pushed towards the supporting member 201 and secured by a securing member 202 at through holes 11 receiving respective spring provided screws 50 is illustrated.

As when assembling the above-described electronic device 1A, when assembling the electronic device 200A, first, a semiconductor package 20 is mounted to the wiring board 10, after which a heat-dissipating member 30 (a heat spreader 31 and a heat sink 32) is thermally coupled to the semiconductor package 20. Next, spring provided screws 50 are inserted into through holes 32b of the heat sink 32 of the heat-dissipating member 30, the securing member 202 is mounted, and the spring provided screws 50 are inserted into through holes 11 of the wiring board 10. Then, by screwing the spring provided screws 50 into end portions of the supporting member 201 arranged at a back surface of the wiring board 10, the wiring board 10 having the semiconductor package 20 mounted thereto is secured between the heat-dissipating member 30 and the supporting member 201.

Here, the securing member 202 is formed so as to be capable of being tightened towards the supporting member 201. After screwing the spring provided screws 50 into the supporting member 201, the securing member 202 is further tightened, so that end portions of the wiring board 10 are pushed towards and secured to the supporting member 201.

In such an electronic device 200A, when the wiring board 10 is not deformed as illustrated in FIG. 6A, the flat wiring board 10 is supported by a flat surface of the supporting member 201 from a back surface side of the wiring board 10, so that the wiring board 10 can be secured between the supporting member 201 and the heat-dissipating member 30.

However, depending upon a twisting amount of each spring provided screw 50 that connects the supporting member 201 and the heat-dissipating member 30 to each other, a load distribution in a plane applied to a connection portion between the wiring board 10 and the semiconductor package 20 may become non-uniform. That is, by connecting the supporting member 201 in a tilted state to the heat-dissipating member 30, and supporting the wiring board 10 by the tilted supporting member 201, the load distribution applied to the connection portion between the wiring board 10 and the semiconductor package 20 becomes non-uniform.

As a result of the non-uniform load distribution, a load applied to a portion of the connection portion may become excessive, and may damage the connection portion. Further, when the wiring board 10 is deformed resulting from the heat generated during the operation of the assembled electronic device 200A due to the non-uniform load distribution, the connection portion may be more easily damaged.

During the mounting of the semiconductor package 20, if, for example, the wiring board 10 is deformed, and the electronic device 200A is assembled using the flat supporting member 201, as illustrated in FIG. 6B, the deformed wiring board 10 is secured while its end portions are supported by the supporting member 201. A gap 203 is formed between the flat supporting member 201 and a central portion of the deformed wiring board 10. Even in this case, similarly, depending upon a twisting amount of each spring provided screw 50, problems such as an excessive load being applied to a portion of the connection portion occur.

When a heat load is applied to the wiring board 10 due to the heat being generated during the operation of the assembled electronic device 200A, the wiring board 10 may become deformed. The deformation of the wiring board 10 caused by the heat load during the operation of the electronic device 200A occurs from the flat state of the wiring board 10 as illustrated in FIG. 6A or from the deformed state of the wiring board 10 as illustrated in FIG. 6B. In either case, in the electronic device 200A, the wiring board 10 is deformed with the secured end portions being fulcra.

In this case, in addition to stress (internal stress) resulting from the deformation of the wiring board 10 itself, stress (external stress) resulting from securing the end portions of the wiring board 10 may also be generated in the wiring board 10. As a result, a large stress is generated at the connection portion between the wiring board 10 and the semiconductor package 20 due to the increase in the amount of the deformation. Therefore, damage (such as, cracks or breakage) tends to occur at the connection portion, for example, at the connection portion at an end portion side of the wiring board 10 where the difference between dimensions before and after the deformations is large. For convenience sake, FIG. 6B illustrates the case in which a breakage 204 occurs in a portion of the connection portion.

Such breakage similarly occurs even when the end portions of the wiring board 10 are only supported by the flat supporting member 201 (that is, when the end portions are not secured with the securing member 202). That is, the end portions of the back surface of the wiring board 10 that is deformed so that the gap 203 can be formed between it and the supporting member 201 are supported by the supporting member 201, so that the wiring board 10 is pushed towards the semiconductor package 20. Therefore, the deformation of the wiring board 10 occurs with the end portions of the back surface thereof that are supported by the supporting member 201 being fulcra as when the end portions thereof are secured. Since the end portions of the wiring board 10 are supported, an external stress is generated at the wiring board 10. Therefore, the wiring board 10 is considerably deformed, which tends to damage the connection portion of the wiring board 10.

In contrast to the electronic device 200A using the flat supporting member 201, in the electronic device 1A illustrated in FIGS. 1 to 4B, the central portion of the flat or deformed wiring board 10 is supported by the convex surface 41a of the first supporting section 41 of the supporting member 40. The end portions of the wiring board 10 are suspended from the supporting member 40 (second supporting section), and are not restrained.

In the electronic device 1A, even if the turning amount of each spring provided screw 50 into the second supporting section 42 is not uniform when the electronic device 1A is assembled, it is possible to support the central portion of the wiring board 10 by the convex surface 41a, and to push the wiring board 10 towards the heat-dissipating member 30. This makes it possible to make uniform the load distribution applied to the connection portion between the wiring board 10 and the semiconductor package 20.

In the electronic device 1A, when a heat load is applied after assembling it, the wiring board 10 is capable of being deformed with a portion of the wiring board 10 supported by the convex surface 41a being a fulcrum. Therefore, it is possible to reduce external stress that is generated when the wiring board 10 is deformed with its end portions as fulcra, and to reduce the deformation amount of the wiring board 10.

Exemplary changes in the shape of the wiring board 10 are illustrated in Table 1. In Table 1, for convenience sake, two wiring boards 10 are represented as a wiring board X and a wiring board Y, respectively.

TABLE 1

|  | BEFORE MOUNTING | AFTER MOUNTING | AFTER HEAT CYCLE TEST (SHAPE CHANGING RATE AFTER MOUNTING) |
|---|---|---|---|
| WIRING BOARD X | 0 μm | −70 μm | −50 μm (29%) |
| WIRING BOARD Y | 0 μm | −60 μm | −10 μm (83%) |

Table 1 represents the deformation amounts of central portions of the wiring boards X and Y before and after mounting the semiconductor package 20, and the deformation amounts of the central portions of the wiring boards X and Y when a heat cycle test is performed after assembling the electronic devices 1A and 200A using the wiring boards X and Y.

The central portions of the wiring boards X and Y are areas that correspond to mounting areas of the semiconductor package 20. The heat cycle test was performed under the conditions in which the temperatures of the electronic devices 1A and 200A assembled using the wiring boards X and Y were repeatedly raised and lowered for 500 cycles in a range of from −10° C. to 100° C. The deformation amounts of the central portions of the wiring boards X and Y were measured with a three-dimensional shape measuring apparatus. The measurement of the deformation amounts of the wiring boards X and Y after the heat cycle test was performed on the wiring boards X and Y that were taken out by disassembling the electronic devices 1A and 200A.

From Table 1, if the deformation amounts of the central portions of the wiring boards X and Y prior to mounting the semiconductor package 20 are 0 μm, the deformation amounts of the wiring boards X and Y after mounting the semiconductor package 20 are −70 μm and −60 μm, which were substantially the same.

The electronic device 1A was assembled using the wiring board X, the electronic device 200A was assembled using the wiring board Y, and the predetermined heat cycle test was performed on each of the electronic devices 1A and 200A. The results thereof were as follows. The deformation amount after the heat cycle test of the central portion of the wiring board X used in the electronic device 1A was −50 μm, so that a change in shape of approximately 29% from −70 μm, which was the deformation amount after mounting the semiconductor package 20, was confirmed. On the other hand, the deformation amount after the heat cycle test of the central portion of the wiring board Y used in the electronic device 200A was −10 μm, so that a change in shape of approximately 83% from −60 μm, which was the deformation amount after mounting the semiconductor package 20, was confirmed. In the wiring board X used in the electronic device 1A, the change in shape was approximately three times less than that in the wiring board Y used in the electronic device 200A.

Accordingly, even for the wiring boards X and Y whose central portions have substantially the same deformation amounts after mounting the semiconductor package 20, the deformation amounts of the central portions of the wiring boards X and Y obtained after the heat cycle test may be considerably different due to the differences between the electronic devices 1A and 200A to which they are applied.

That is, as in the electronic device 200A, in a type in which the wiring board 10 (wiring board Y) is deformed with its end portions being fulcra as a result of supporting the wiring board 10 by the flat supporting member 201, the deformation amount of the central portion of the wiring board 10 obtained after the heat cycle test becomes large. This is due to a relatively large external stress being generated at the wiring board 10 as a result of the support to the wiring board 10 provided by the flat supporting member 201.

In contrast, as in the electronic device 1A, in a type in which the wiring board 10 (wiring board X) is supported by the convex surface 41a and is capable of being deformed with a portion of the wiring board 10 supported by the convex surface 41a being a fulcrum, it is possible to reduce external stress generated at the wiring board 10. As a result, it is possible to reduce the amount of deformation of the wiring board 10 occurring after the heat cycle test.

As described above, in the electronic device 1A, the influence that the deformations of the wiring board 10 before and after the assemblage have on the connection portion between the wiring board 10 and the semiconductor package 20 can be restricted by supporting the wiring board 10 by the convex surface 41a.

In the electronic device 1A, the first supporting section 41 of the supporting member 40 can be continuously raised or lowered by rotating the supporting section 41. Therefore, after assembling the electronic device 1A, it is possible to raise or lower the first supporting section 41 in accordance with the deformation of the wiring board 10 to push the wiring board 10 towards the heat-dissipating member 30 under a constant load.

According to such an electronic device 1A, it is possible to effectively maintain the electrical connection between the wiring board 10 and the semiconductor package 20, as a result of which the electronic device 1A that is highly reliable can be realized.

Although, in the foregoing description, the case in which the semiconductor package 20 is coupled to the wiring board 10 using the bumps 60 is described as an example, the present invention is similarly applicable to a case in which the supporting member 40 connects the semiconductor package 20 to the wiring board 10 using, for example, a socket.

Figure 7:
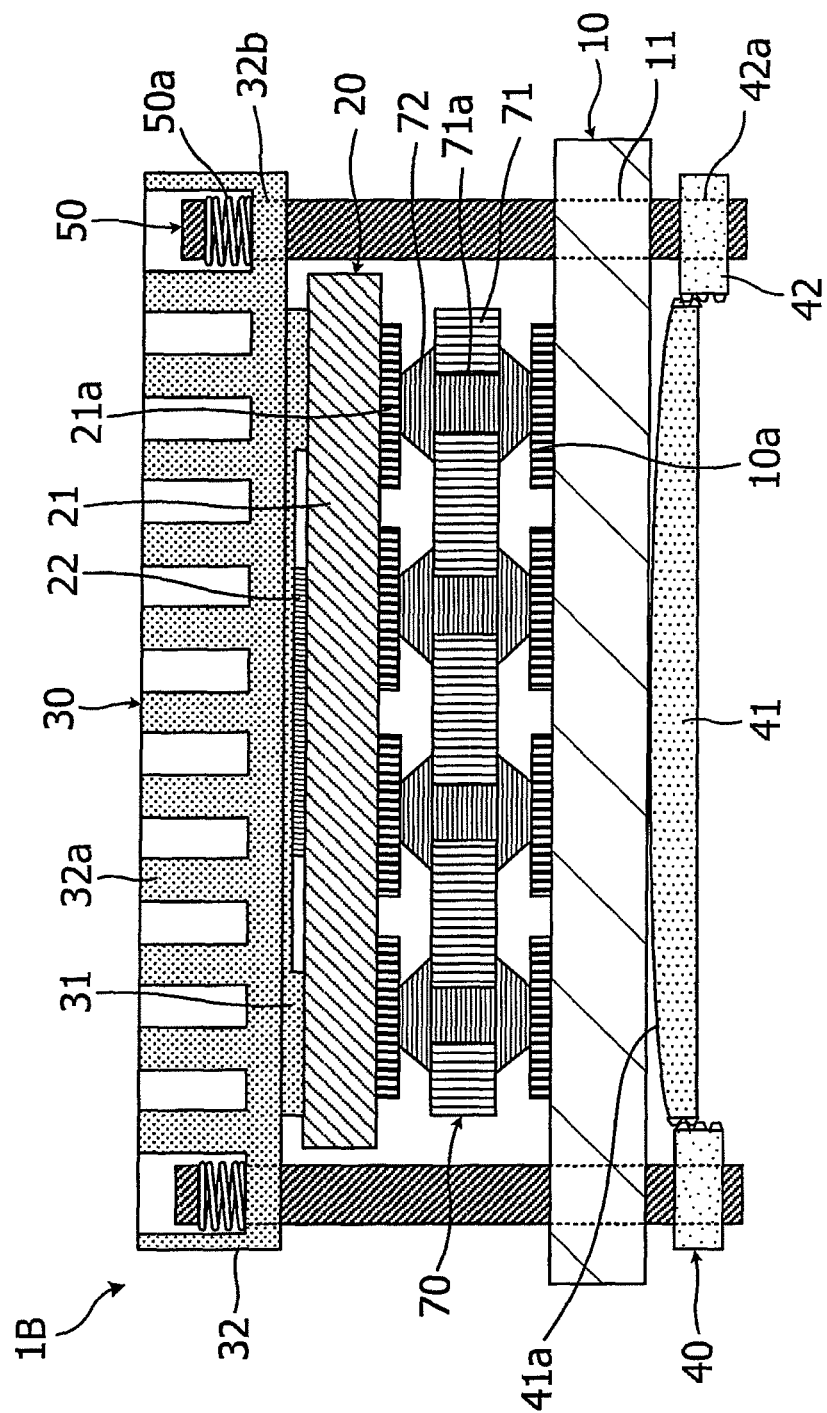
FIG. 7 is a sectional view of another exemplary electronic device according to the first embodiment.

FIG. 7 is a sectional view of another exemplary electronic device according to the first embodiment.

An electronic device 1B illustrated in FIG. 7 differs from the electronic device 1A in that a wiring board 10 and a semiconductor package 20 are coupled to each other with a socket 70.

The socket 70 has an insulating base 71 provided with through holes 71a. The number of through holes 71a (here, four through holes are used as the example) is the same as the number of electrodes 10a of the wiring board 10 and the number of electrodes 21a of the semiconductor package 20. Columns 72 that protrude from a front surface and a back surface of the insulating base 71 (that is, a surface at a side of the semiconductor package 20 and a surface at a side of the wiring board 10) are provided at the respective through holes 71a of the insulating base 71 so as to extend therethrough. The columns 72 are electrically conductive, and are resilient. The wiring board 10 and the semiconductor package 20 are electrically coupled to each other by the columns 72.

The electronic device 1B using the socket 70 can be assembled, for example, as follows.

First, the socket 70 is aligned with each electrode 10a and each column 72 above the wiring board 10, and is arranged above the wiring board 10. Then, the semiconductor package 20 is aligned with each column 72 and each electrode 21a at the upper side of the socket 70, and is arranged at the upper side of the socket 20. A heat spreader 31 and a heat sink 32 of a heat-dissipating member 30 are thermally coupled to the semiconductor package 20 arranged in this way. Spring provided screws 50 are inserted into through holes 32b of the heat sink 32 and through holes 11 of the wiring board 10, and are screwed into threaded holes 42a of a supporting member 40 arranged at a back surface of the wiring board 10.

The spring provided screws 50 are screwed into the threaded holes 42a from the front ends to a predetermined location. Then, a first supporting section 41 is rotated and raised towards the wiring board 10. By this, the semiconductor package 20, the socket 70, and the wiring board 10 are secured between the heat-dissipating member 30 and the supporting member 40.

By raising the first supporting section 41, the electrodes 21a of the semiconductor package 20 are press-contacted against upper end sides of the columns 72, and the electrodes 10a of the wiring board 10 are press-contacted against lower end sides of the columns 72. Accordingly, the wiring board 10 and the semiconductor package 20 are electrically coupled to each other by the columns 72.

In the electronic device 1B, the wiring board 10 is supported by a convex surface 41a of the first supporting section 41 of the supporting member 40. When assembling the electronic device 1B, the wiring board 10 is pushed towards the semiconductor package 20 while being supported by the convex surface 41a. Therefore, each electrode 10a of the wiring board 10 can be pushed against each column 72 of the socket 70 under a uniform load.

Figure 8:
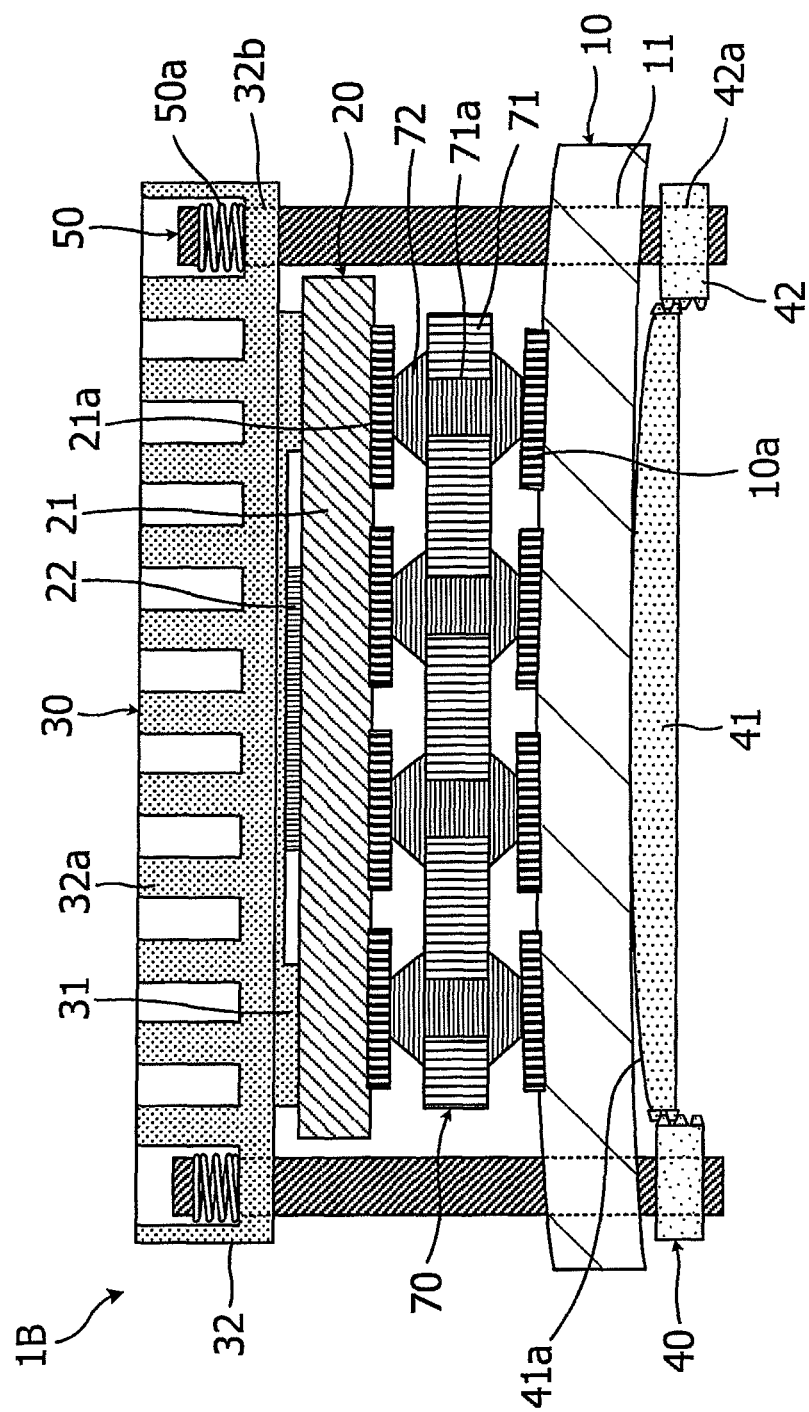
FIG. 8 illustrates a case in which a wiring board of the another exemplary electronic device according to the first embodiment is deformed.

FIG. 8 illustrates a case in which a wiring board 10 of the another exemplary electronic device 1B according to the first embodiment is deformed.

In the electronic device 1B, the wiring board 10 may become deformed due to heat load during operation of the electronic device 1B. When the wiring board 10 is deformed due to the heat load during the operation of the electronic device 1B, the wiring board 10 is deformed with a portion thereof supported by the convex surface 41a being a fulcrum.

Here, for comparison, an electronic device including a flat supporting member not having a convex surface 41a such as that described above will be described.

Figure 9B:
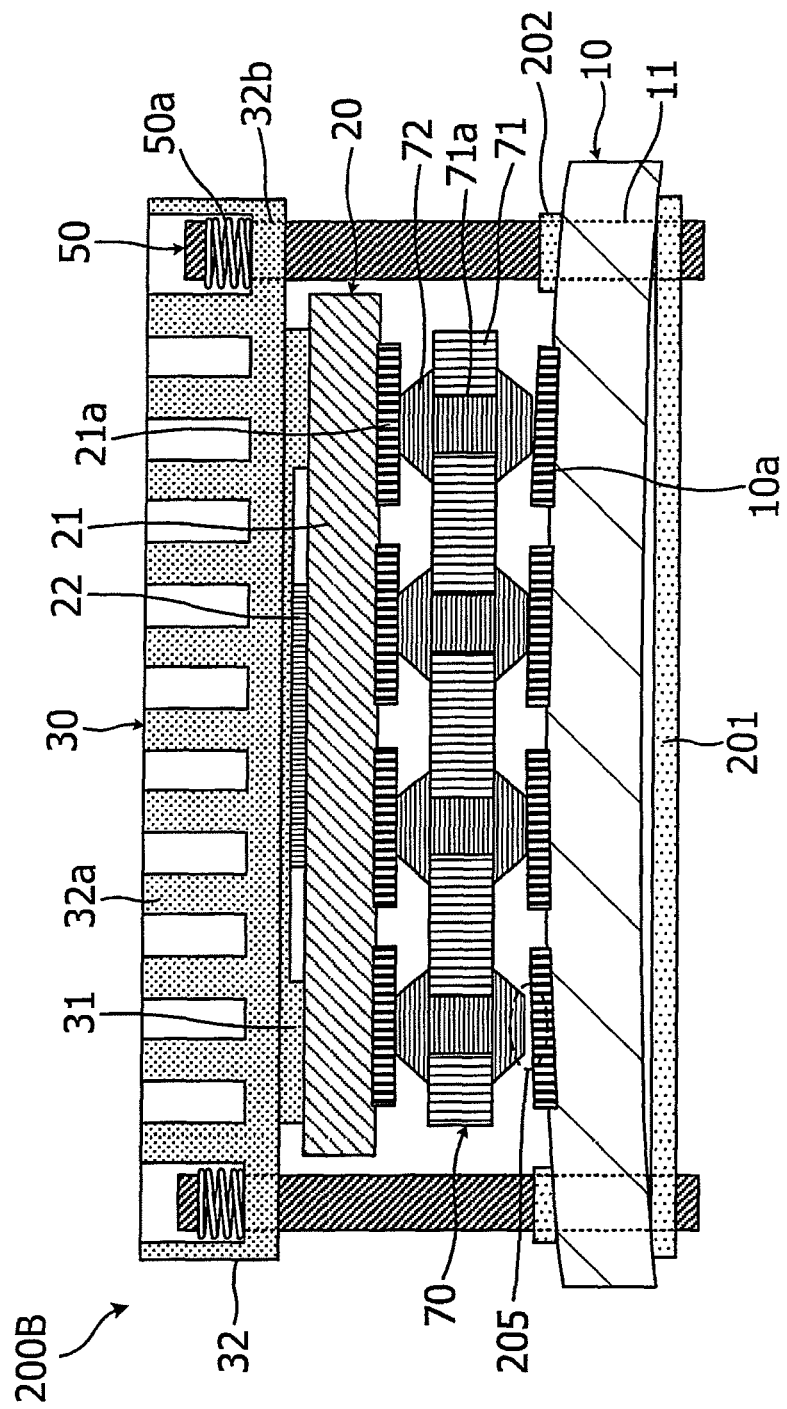

FIG. 9A is a sectional view of an exemplary electronic device 200B using a flat supporting member 201. FIG. 9B illustrates a case in which a wiring board 10 of the electronic device 200B using the flat supporting member 201 is deformed.

The electronic device 200B illustrated in FIG. 9A differs from the electronic device 200A illustrated in FIG. 6A in that the wiring board 10 and a semiconductor package 20 are coupled to each other using a socket 70. In the electronic device 200B, end portions of the wiring board 10 are secured with a securing member 202.

As illustrated in FIG. 9A, in the electronic device 200B, the wiring board 10 is pushed towards the semiconductor package 20 by the flat supporting member 201. In this case, depending upon a turning amount of each spring provided screw 50, a force that pushes the semiconductor board 10 towards the semiconductor package 20 may become non-uniform in a plane. As a result, contact force between some columns 72 and electrodes 10a and that between some columns 72 and electrodes 21a become insufficient, or some columns 72 do not contact some electrodes 10a and 21a, as a result of which electrical connection between the wiring board 10 and the semiconductor package 20 may not be ensured. The problem of the contact pressures being insufficient and the problem of some columns 72 not being in contact with some electrodes 10a and 21a also occur when the wiring board 10 is deformed during the assembly.

In the electronic device 200B, as illustrated in FIG. 9B, the wiring board 10 may become deformed due to heat load during operation of the assembled electronic device 200B. The wiring board 10 is deformed with the secured end portions being fulcra. In this case, as discussed above, external stress is generated at the wiring board 10 by securing its end portions, thereby increasing a deformation amount. As a result, as described above, defective continuity 205 may occur because, for example, the contact pressure between some columns 72 and electrodes 10a and the contact pressure between some columns 72 and electrodes 21a are insufficient or because some columns 72 do not contact some electrodes 10a and 21a. The problem that the contact pressures are insufficient and the problem that some columns 72 do not contact some electrodes 10a and 21a similarly occur even when the end portions of the wiring board 10 are only supported by the flat supporting member 201 (that is, when the end portions are not secured with the securing member 202).

In contrast to the electronic device 200B using the flat supporting member 201, the wiring board 10 is supported by the convex surface 41a of the first supporting section 41 of the supporting member 40 in the electronic device 1B illustrated in FIGS. 7 and 8.

Therefore, when the electronic device 1B is assembled, non-uniformity in a plane of a force that pushes the wiring board 10 towards the semiconductor package 20, and the occurrence of defective continuity between the wiring board 10 and the semiconductor package 20 can be reduced.

When a heat load is applied after assembling the electronic device 1B, the wiring board 10 can be deformed with a portion thereof supported by the convex surface 41a being a fulcrum. Therefore, in the wiring board 10, it is possible to reduce external stress such as that produced when the wiring board 10 is deformed with its end portions as fulcra, and to reduce the amount of deformation of the wiring board 10. Further, in the electronic device 1B, after the assembly, it is possible to push the wiring board 10 towards the semiconductor package 20 under a constant load by raising or lowering the first supporting section 41 in accordance with the deformation of the wiring board 10. As a result, it is possible to reduce the occurrence of defective continuity between the wiring board 10 and the semiconductor package 20.

Accordingly, even in the electronic device 1B using the socket 70, when the wiring board 10 is supported by the convex surface 41a, it is possible to effectively maintain the electrical connection between the wiring board 10 and the semiconductor package 20; and an electronic device 1B that is highly reliable can be provided.

The electronic devices 1A and 1B are described above. In each of the electronic devices 1A and 1B, it is possible to manually or automatically rotate the first supporting section 41 of the supporting member 40, and raise or lower the first supporting section 41 with respect to the second supporting section 42.

For example, it is possible to provide a hole configured to receive a jig, such as a driver or a wrench, in a surface of the first supporting section 41 at a side opposite to a the surface where the convex surface 41 is provided; rotate the first supporting section 41 using the jig inserted in the hole; and raise or lower the first supporting section 41. Alternatively, it is possible to connect a motor or an actuator to the first supporting section 41, and control an operation of the motor or the actuator so as to rotate the first supporting section 41, thereby raising or lowering the first supporting section 41.

In the foregoing description, the case in which the first supporting section 41 is screwed into the second supporting section 42 having a circular ring shape in plan view is described as an example. The shape of the second supporting section 42 is not limited to the shape in the example as long as the first supporting section 41 can be mounted to a central portion so that it can be raised or lowered. For example, the shape of the second supporting section 42 may be a rectangular ring shape for allowing the first supporting section 41 to be mounted to the central portion of a plate that is rectangular in plan view.

It is desirable that the first supporting section 41 and the second supporting section 42 of the supporting member 40 be formed of a material having a constant rigidity that does not easily allow them to be deformed by mechanical pressure or load applied when operating or assembling the electronic device 1A or 1B. For example, the first supporting section 41 is formed of a material having a rigidity that does not allow the first supporting section 41 itself to be flexed when operating or assembling the electronic device 1A or 1B.

Next, a second embodiment will be described.

Figure 10:
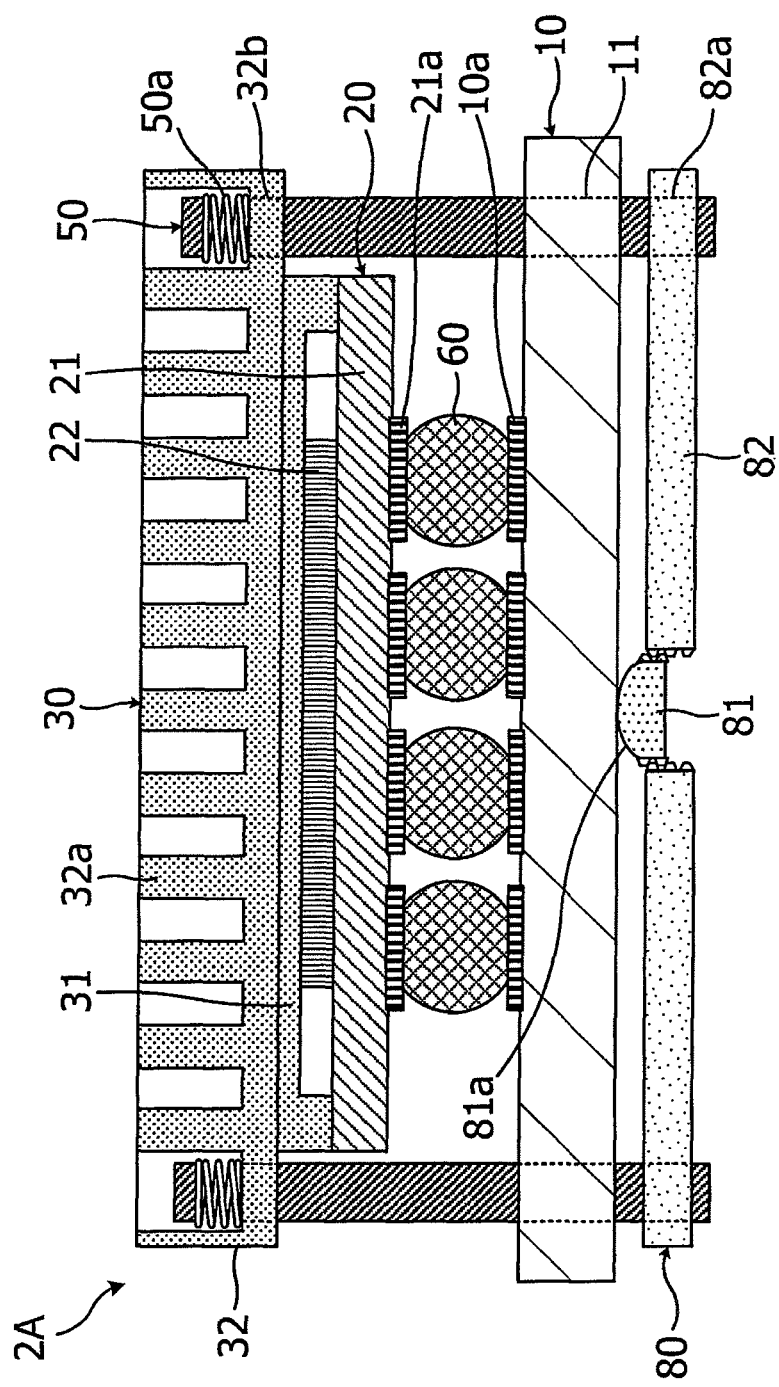
FIG. 10 is a sectional view of an exemplary electronic device according to a second embodiment of the present invention.
Figure 11A:
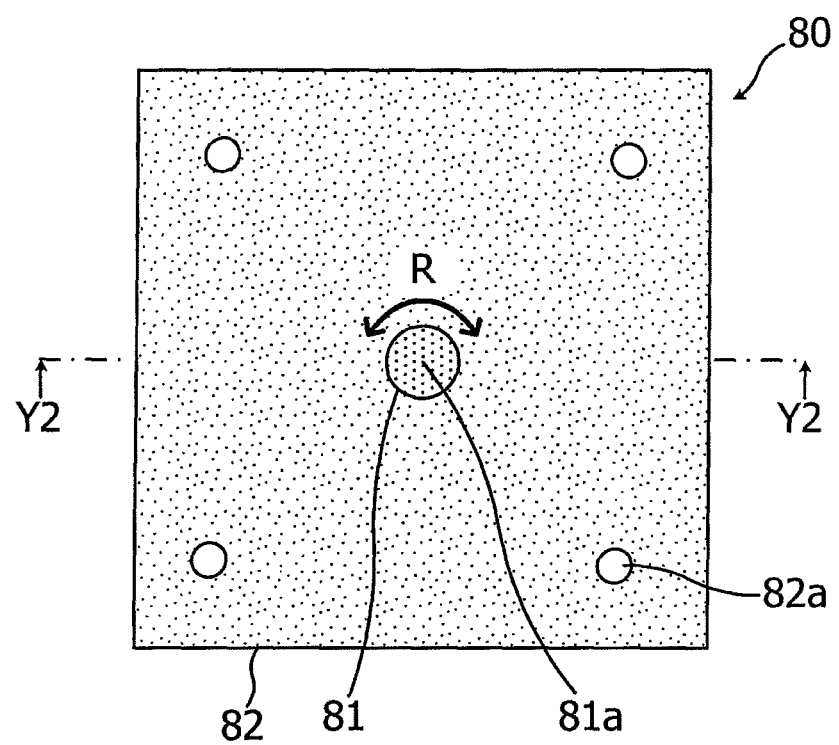
FIGS. 11A and 11B illustrate an exemplary supporting member used in the exemplary electronic device according to the second embodiment.
Figure 11B:
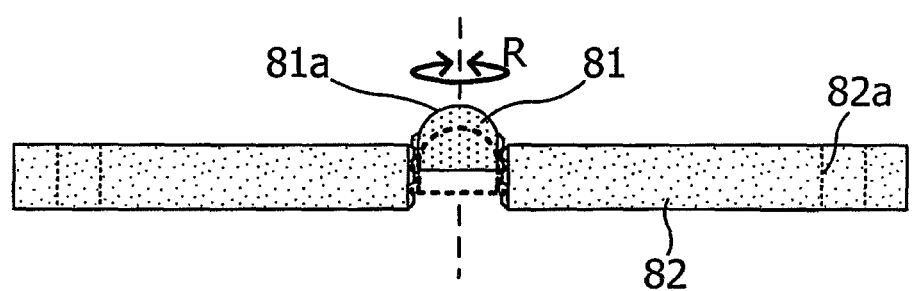

FIG. 10 is a sectional view of an exemplary electronic device 2A according to the second embodiment. FIGS. 11A and 11B illustrate an exemplary supporting member 80 used in the electronic device 2A according to the second embodiment, with FIG. 11A being a plan view and FIG. 11B being a sectional view taken along line Y2-Y2 in FIG. 11A.

In the electronic device 2A according to the second embodiment, a wiring board 10 coupled to a semiconductor package 20 through bumps 60 is supported using the supporting member 80 illustrated in FIGS. 10, 11A, and 11B. The other structural features are similar to those of the electronic device 1A.

The supporting member 80 used in the electronic device 2A includes a first supporting section 81 and a second supporting section 82. The first supporting section 81 has a convex surface 81a that is curved in a convex form towards the wiring board 10. The second supporting section 82 has a rectangular ring shape in plan view and has the first supporting section 81 screwed into it.

The first supporting section 81 is arranged in an area that is situated at a central portion of a back surface of the wiring board 10 and is narrower than the first supporting section 41 of the supporting member 40. The first supporting section 81 is raised and lowered with respect to the second supporting section 82 by rotating the first supporting section 81 in directions R of thick double-headed arrows illustrated in FIGS. 11A and 11B. By rotating the first supporting section 81, the first supporting section 81 can be continuously raised or lowered in a single step. The second supporting section 82 has threaded holes 82a into which are screwed spring provided screws 50 inserted in through holes 11 of the wiring board 10 and through holes 32b of a heat sink 32.

As illustrated in FIG. 10, in the electronic device 2A, the central portion of the back surface of the wiring board 10 is supported by the convex surface 81a of the supporting section 81 of the supporting member 80.

The electronic device 2A is assembled similarly to the electronic device 1A except that, for example, instead of using the supporting member 40 of the electronic device 1A, the supporting member 80 illustrated in FIGS. 10, 11A, and 11B is used.

As illustrated in FIG. 10, in the electronic device 2A, the central portion of the back surface of the wiring board 10 having the semiconductor package 20 mounted at a central portion of its front surface is supported by the convex surface 81a of the first supporting section 81; and the wiring board 10 is secured between the supporting member 80 and a heat-dissipating member 30 (a heat spreader 31 and a heat sink 32). At this time, the wiring board 10 is secured while being suspended from the second supporting section 82. The wiring board 10 is not restrained at the through holes 11 in which the spring provided screws 50 are inserted. In FIG. 10, the flat wiring board 10 that is not deformed is illustrated as an example. The wiring board 10 that is deformed is similarly supported by the convex surface 81a of the first supporting section 81.

By supporting the wiring board 10 by the convex surface 81a in this way, when the electronic device 2A is assembled, it is possible to make uniform a load distribution applied to a connection portion between the wiring board 10 and the semiconductor package 20.

When a heat load is applied after assembling the electronic device 2A, the wiring board 10 is deformable with a portion thereof supported by the convex surface 81a being a fulcrum, with the generation of external stress being restricted. Therefore, a deformation amount of the wiring board 10 can be reduced. Further, in the electronic device 2A, after the assembly, it is possible to raise or lower the first supporting section 81 in accordance with the deformation of the wiring board 10 so as to push the wiring board 10 towards the heat-dissipating member 30 under a constant load.

Therefore, electrical connection between the wiring board 10 and the semiconductor package 20 can be effectively maintained.

The supporting member 80 is similarly applicable when the semiconductor package 20 is coupled to the wiring board 10 using a socket 70 instead of bumps 60.

Figure 12:
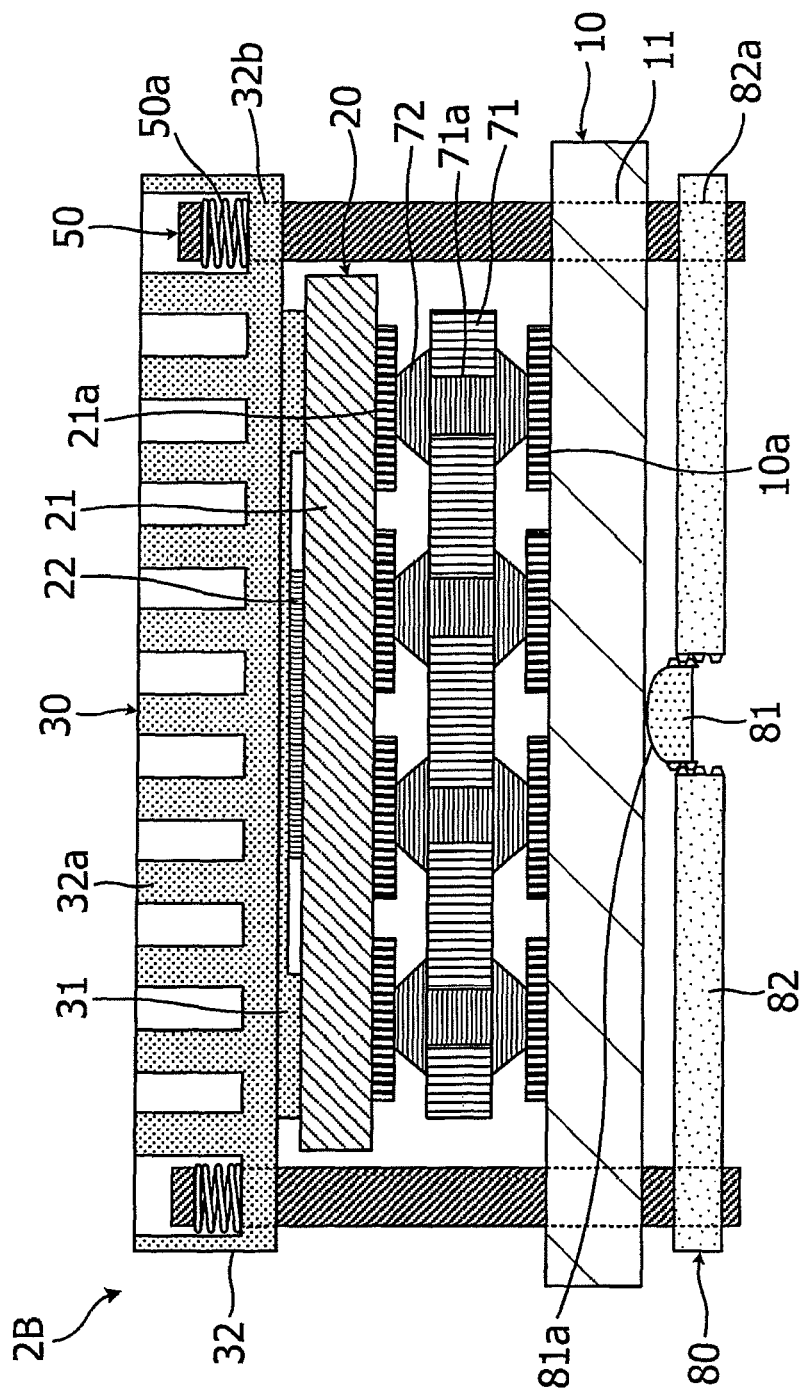
FIG. 12 is a sectional view of another exemplary electronic device according to the second embodiment.

FIG. 12 is a sectional view of another exemplary electronic device 2B according to the second embodiment.

In the electronic device 2B illustrated in FIG. 12, a wiring board 10 and a semiconductor package 20 are coupled to each other using the socket 70 having columns 72 provided at respective through holes 71a of an insulating base 71. The other structural features are similar to those of the electronic device 2A.

The electronic device 2B can be assembled similarly to the electronic device 1B except that, for example, the supporting member 80 illustrated in FIG. 12 is used instead of the supporting member 40 of the electronic device 1B.

As illustrated in FIG. 12, in the electronic device 2B, the wiring board 10 is supported by a convex surface 81a of a first supporting section 81, and is pushed towards the semiconductor package 20. In FIG. 12, the flat wiring board 10 that is not deformed is illustrated as an example. The wiring board 10 that is deformed is similarly supported by the convex surface 81a of the first supporting section 81 of the supporting member 80.

Therefore, when the electronic device 2B is assembled by supporting the wiring board 10 by the convex surface 81a in this way, non-uniformity in a plane of a force that pushes the wiring board 10 towards the semiconductor package 20 can be reduced.

When a heat load is applied after assembling the electronic device 2B, the wiring board 10 can be deformed with a portion thereof supported by the convex surface 81a being a fulcrum, with the generation of external stress being reduced. Therefore, it is possible to reduce the amount of deformation of the wiring board 10. Further, in the electronic device 2B, after the assembly, it is possible to push the wiring board 10 towards the semiconductor package 20 under a constant load by raising or lowering the first supporting section 41 in accordance with the deformation of the wiring board 10.

Therefore, it is possible to reduce the occurrence of defective continuity between the wiring board 10 and the semiconductor package 20, and to effectively maintain electrical connection between the wiring board 10 and the semiconductor package 20.

As in the supporting member 40, it is possible to manually or automatically rotate the first supporting section 81 of the supporting member 80, and raise or lower the first supporting section 81 with respect to the second supporting section 82. For example, it is possible to provide a hole for receiving a jig in a surface of the first supporting section 41 at a side opposite to a surface where the convex surface 81a is provided; and rotate the first supporting section 81 using the jig inserted in the hole. Alternatively, it is possible to control an operation of a motor or an actuator coupled to the first supporting section 81 so as to rotate the first supporting section 81.

Here, although the second supporting section 82 has a rectangular ring shape in plan view, the second supporting section 82 may have a circular ring shape in plan view.

As in the supporting member 40, it is desirable that the first supporting section 81 and the second supporting section 82 of the supporting member 80 be formed of a material having a constant rigidity that does not easily allow them to be deformed when operating or assembling the electronic device 2A or 2B. For example, the second supporting section 82 is formed of a material having a rigidity that does not allow the second supporting section 82 itself to be flexed when operating or assembling the electronic device 2A or 2B. Since the first supporting section 81 is provided in a relatively narrow area in the supporting member 80, it is possible to reduce the flexing of the first supporting section 81 itself as long as a certain material is used.

Next, a third embodiment will be described.

Figure 13:
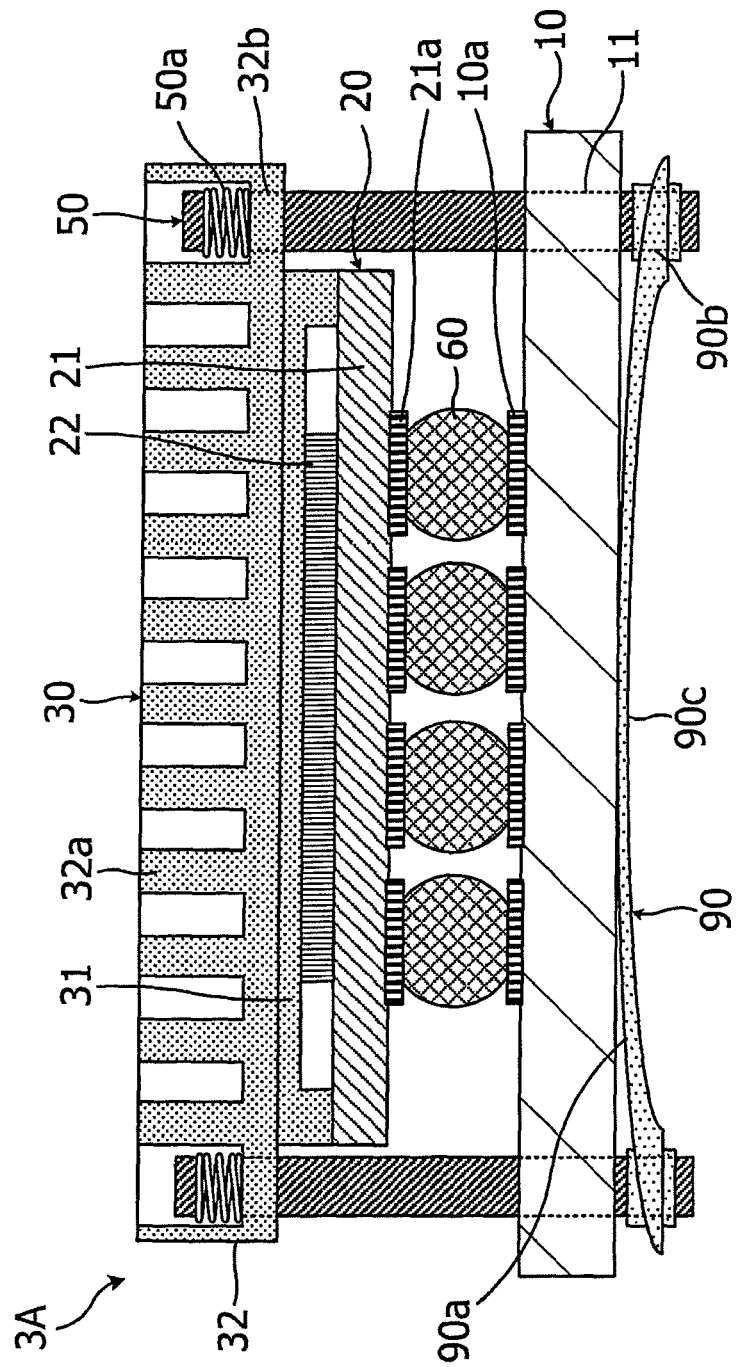
FIG. 13 is a sectional view of an exemplary electronic device according to a third embodiment of the present invention.
Figure 14:
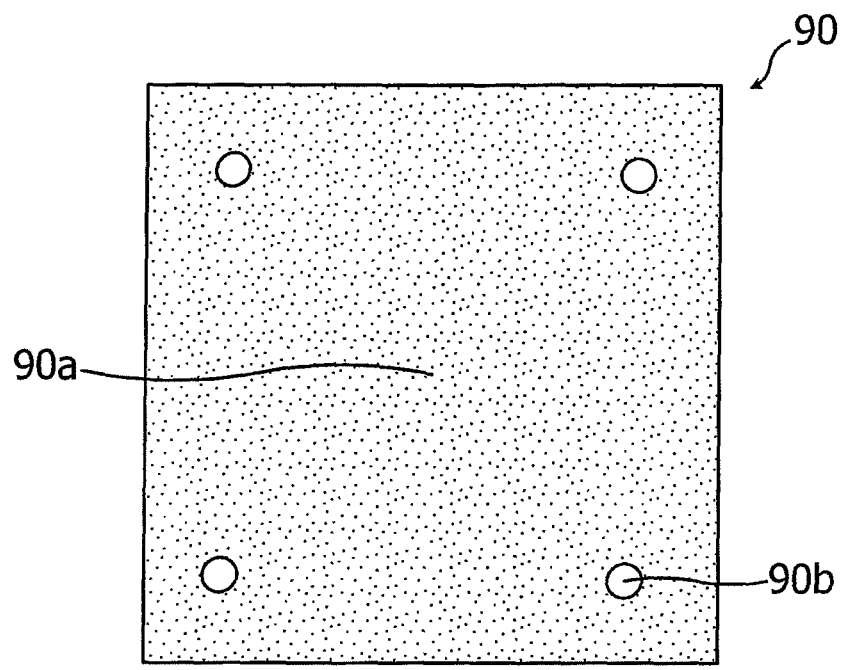
FIG. 14 is a plan view of an exemplary supporting member used in the electronic device according to the third embodiment.

FIG. 13 is a sectional view of an exemplary electronic device 3A according to the third embodiment. FIG. 14 is a plan view of an exemplary supporting member 90 used in the electronic device 3A according to the third embodiment.

In the electronic device 3A according to the third embodiment, a wiring board 10 coupled to a semiconductor package 20 by bumps 60 is supported using the supporting member 90 illustrated in FIGS. 13 and 14. The other structural features are similar to those of the electronic device 1A.

The supporting member 90 used in the electronic device 3A is formed of one plate member, which is rectangular in plan view and has a convex surface 90a that is curved in a convex form towards the wiring board 10. The supporting member 90 has threaded holes 90b into which are secured spring provided screws 50 inserted into through holes 11 of the wiring board 10 and through holes 32b of a heat sink 32.

The electronic device 3A can be assembled similarly to the electronic device 1A except that, for example, the supporting member 90 is used instead of the supporting member 40 of the electronic device 1A. Unlike the supporting member 40 including the first supporting section 41 and the second supporting section 42, the supporting member 90 is formed of one plate member. Therefore, the wiring board 10 having the semiconductor package 20 mounted thereto is secured by coupling the supporting member 90 and a heat-dissipating member 30 to each other with the spring provided screws 50. At this time, since a surface of the supporting member 90 facing the wiring board 10 is the convex surface 90a, even if a screwing amount of the spring provided screws 50 is non-uniform, a central portion of the wiring board 10 is pushed towards the heat-dissipating member 30 at the central portion by the convex surface 90a.

As illustrated in FIG. 13, in the electronic device 3A, the central portion of a back surface of the wiring board 10 having the semiconductor package 20 mounted to a central portion of its front surface is supported by the convex surface 90a of the first supporting member 90, and is secured between the supporting member 90 and the heat-dissipating member 30 (a heat spreader 31 and a heat sink 32). The wiring board 10 is not restrained at the through holes 11 in which the spring provided screws 50 are inserted.

In FIG. 13, the flat wiring board 10 that is not deformed is illustrated as an example. The wiring board 10 that is deformed is similarly supported by the convex surface 90a of the supporting member 90.

Even in the electronic device 3A illustrated in FIG. 13, it is possible to make uniform a load distribution applied to a connection portion between the wiring board 10 and the semiconductor package 20 when assembling the electronic device 3A, and to reduce the deformation amount of the assembled wiring board 10 to a small value. Therefore, electrical connection between the wiring board 10 and the semiconductor package 20 is effectively maintained.

The supporting member 90 is similarly applicable to a case in which the supporting member 90 connects the semiconductor package 20 to the wiring board 10 using, for example, a socket 70 instead of bumps 60.

Figure 15:
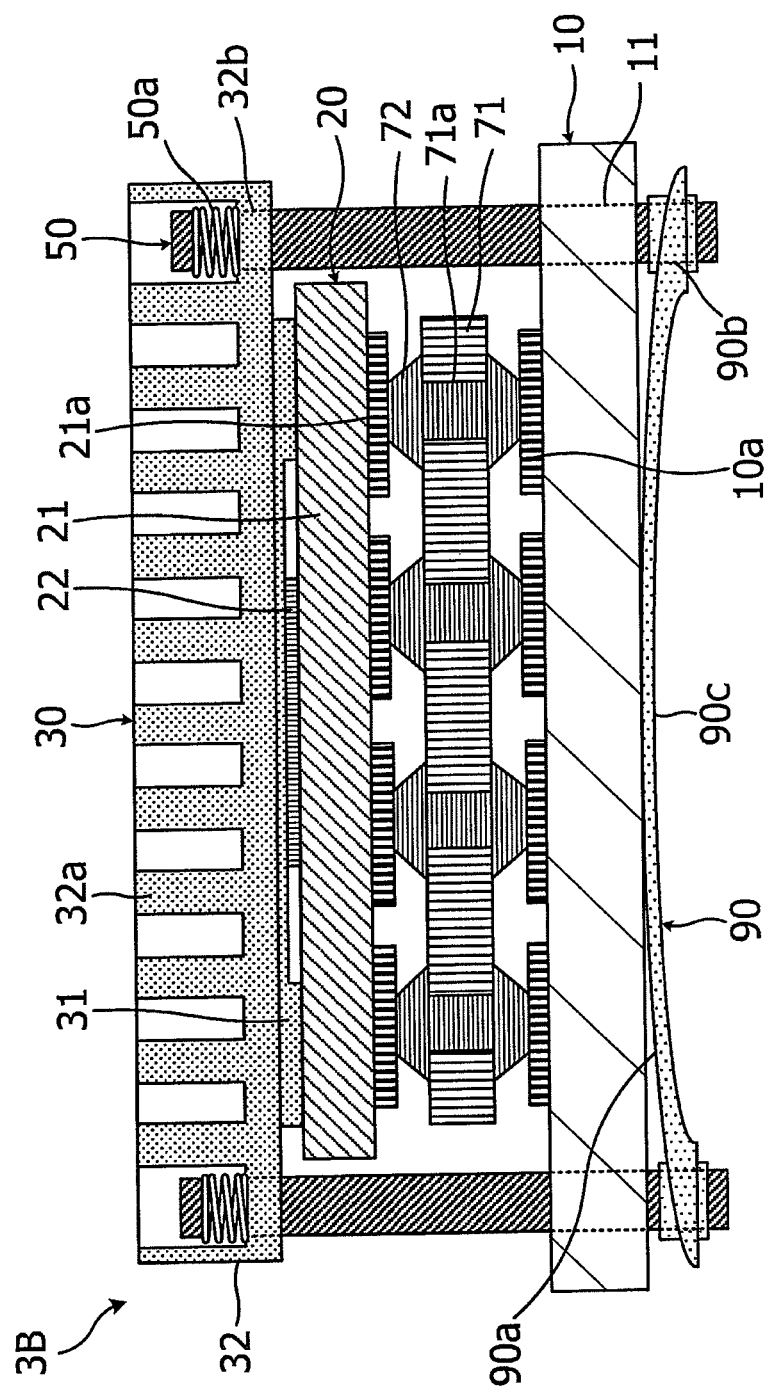
FIG. 15 is a sectional view of another exemplary electronic device according to the third embodiment.

FIG. 15 is a sectional view of another exemplary electronic device according to the third embodiment.

In the electronic device 3B illustrated in FIG. 15, a wiring board 10 and a semiconductor package 20 are coupled to each other using a socket 70 including an insulating base 71 and columns 72. The other structural features are similar to those of the electronic device 3A.

The electronic device 3B can be assembled similarly to the electronic device 1B, except that, for example, a supporting member 90 illustrated in FIG. 15 is used instead of the supporting member 40 of the electronic device 1B. Since the supporting member 90 is formed of one plate member, the semiconductor package 20, the socket 70, and the wiring board 10 are secured to each other by coupling the supporting member 90 and a heat-dissipating member 30 to each other with spring provided screws 50. A surface of the supporting member 90 facing the wiring board 10 is a convex surface 90a. Therefore, even if a twisting amount of the spring provided screws 50 is non-uniform, a central portion of the wiring board 10 is pushed towards the semiconductor package 20 by the convex surface 90a.

As illustrated in FIG. 15, in the electronic device 3B, the supporting member 90 having the convex surface 90a supports the wiring board 10, and pushes the wiring board 10 towards the semiconductor package 20. In FIG. 15, the flat wiring board 10 that is not deformed is illustrated as an example. The wiring board 10 that is deformed is similarly supported by the convex surface 90a of the supporting member 90.

Even in the electronic device 3B illustrated in FIG. 15, during assembly, it is possible to reduce non-uniformity in a plane of a force that pushes the wiring board 10 towards the semiconductor package 20. In addition, it is possible to reduce the deformation amount of the assembled wiring board 10 to a small value. Therefore, it is possible to reduce the occurrence of defective continuity between the wiring board 10 and the semiconductor package 20 and to effectively maintain electrical connection between the wiring board 10 and the semiconductor package 20.

Here, although the supporting member 90 is rectangular in plan view, it may be circular. It is desirable that the supporting member 90 be formed of a material having a constant rigidity that does not easily allow it to be deformed when operating or assembling the electronic device 3A or 3B.

Here, although the supporting member 90 is a dome-shaped member having the convex surface 90a on one side and a concave surface 90c on the other side, the supporting member may be one in which the other side has a flat surface instead of the concave surface 90c. In this case, since the thickness between the convex surface 90a and the flat surface is large, mechanical strength of the supporting member can be increased.

Next, a fourth embodiment will be described.

Figure 16:
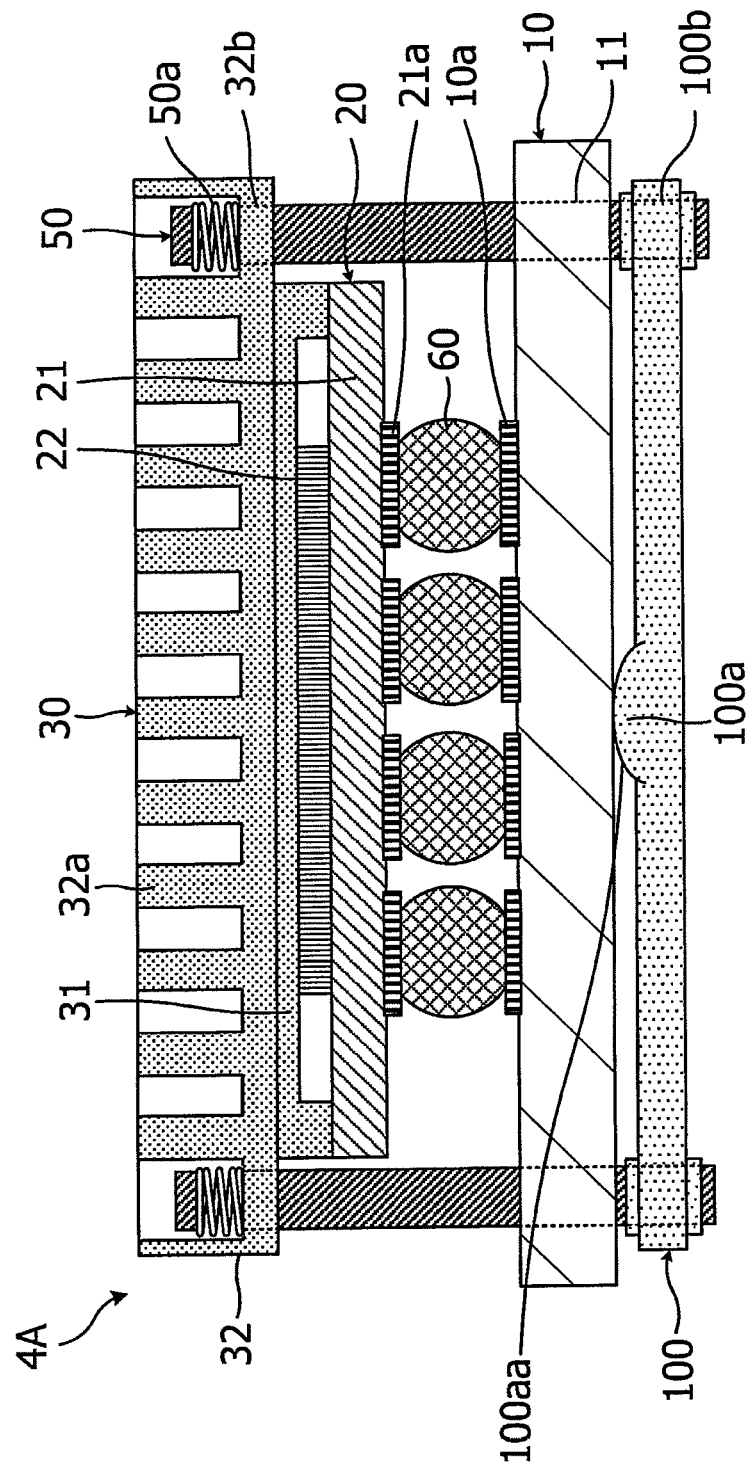
FIG. 16 is a sectional view of an exemplary electronic device according to a fourth embodiment of the present invention.
Figure 17:
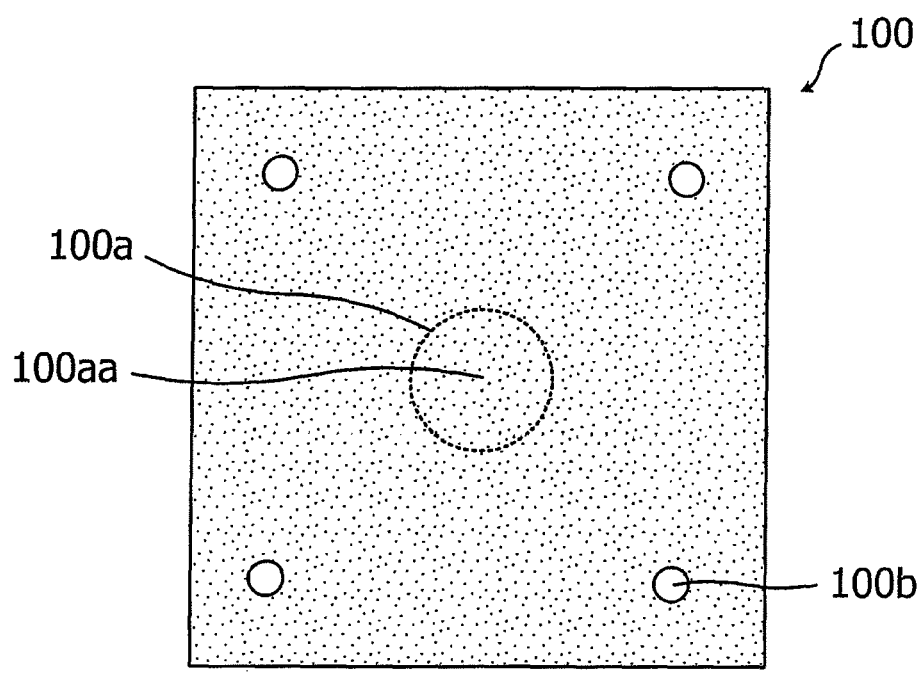
FIG. 17 is a plan view of an exemplary supporting member used in the electronic device according to the fourth embodiment.

FIG. 16 is a sectional view of an exemplary electronic device 4A according to the fourth embodiment of the present invention. FIG. 17 is a plan view of an exemplary supporting member 100 used in the electronic device 4A according to the fourth embodiment.

In the electronic device 4A according to the fourth embodiment, a wiring board 10 coupled to a semiconductor package 20 by bumps 60 is supported using the supporting member 100 illustrated in FIGS. 16 and 17. The other structural features are similar to those of the electronic device 1A.

The supporting member 100 used in the electronic device 4A is formed of one plate member having a protruding portion 100a. The protruding portion 100a has a convex surface 100aa that is curved in a convex form towards the wiring board 10. The supporting member 100 has threaded holes 100b into which are screwed spring provided screws 50 inserted into through holes 11 of the wiring board 10 and through holes 32b of a heat sink 32.

The electronic device 4A can be assembled similar to the electronic device 1A except that, for example, the supporting member 100 is used instead of the supporting member 40 of the electronic device 1A. Unlike the supporting member 40 including the first supporting section 41 and the second supporting section 42, the supporting member 100 is formed of one plate member. Therefore, the wiring board 10 having the semiconductor package 20 mounted thereto is secured by coupling the supporting member 100 and a heat-dissipating member 30 to each other with the spring provided screws 50. At this time, since the supporting member 100 has the protruding portion 100a facing the wiring board 10, even if a twisting amount of the spring provided screws 50 is non-uniform, a central portion of the wiring board 10 is pushed towards the heat-dissipating member 30 by the protruding portion 100a.

As illustrated in FIG. 16, in the electronic device 4A, a central portion of a back surface of the wiring board 10 having the semiconductor package 20 mounted to a central portion of its front surface is supported by the protruding portion 100a, and is secured between the supporting member 100 and the heat-dissipating member 30 (a heat spreader 31 and a heat sink 32). The wiring board 10 is not restrained at the through holes 11 in which the spring provided screws 50 are inserted. In FIG. 16, the flat wiring board 10 that is not deformed is illustrated as an example. The wiring board 10 that is deformed is similarly supported by the protruding portion 100a of the supporting member 100.

Even in the electronic device 4A illustrated in FIG. 16, electrical connection between the wiring board 10 and the semiconductor package 20 is similarly effectively maintained.

The supporting member 100 is similarly applicable when the semiconductor package 20 is coupled to the wiring board 10 using a socket 70 instead of bumps 60.

Figure 18:
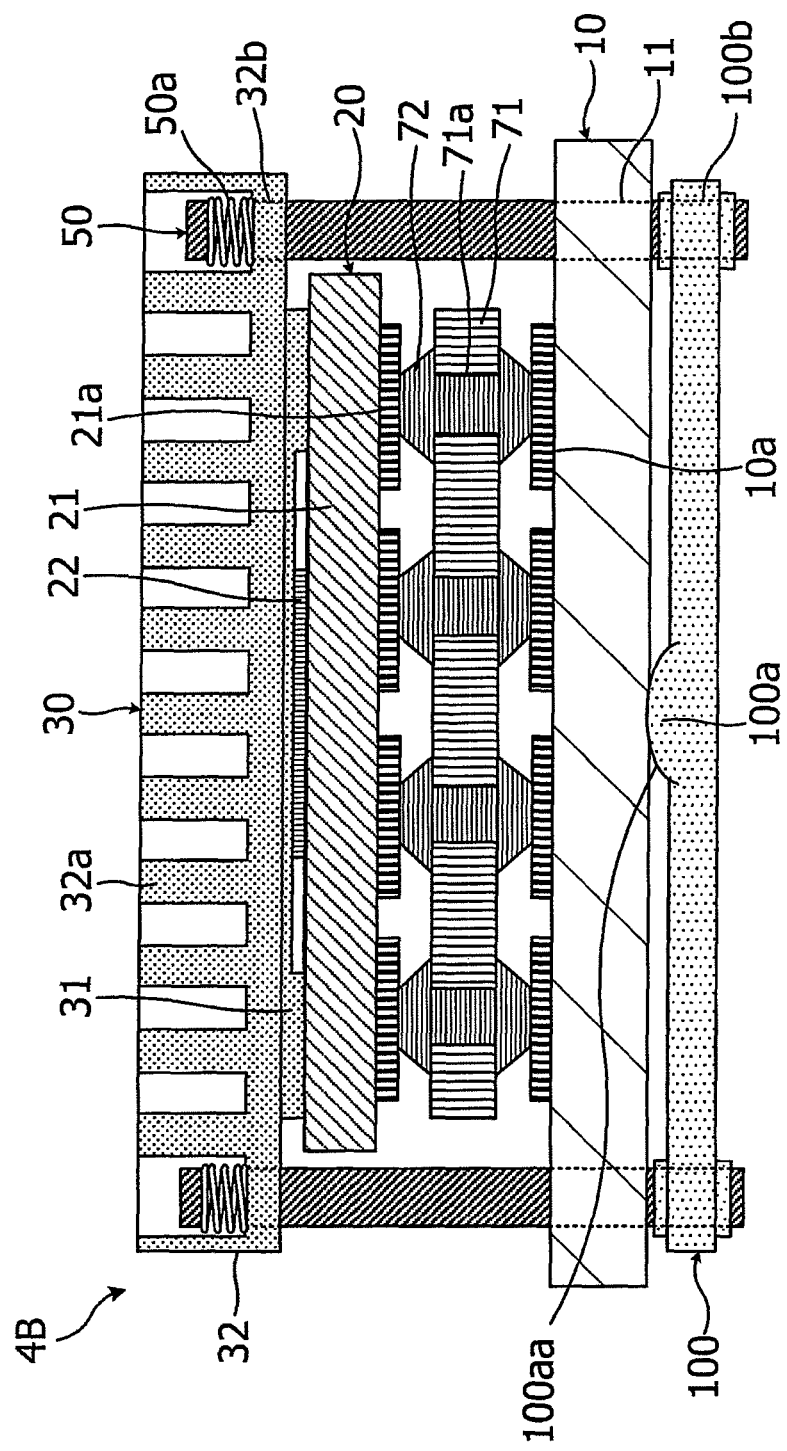
FIG. 18 is a sectional view of another exemplary electronic device according to the fourth embodiment.

FIG. 18 is a sectional view of another exemplary electronic device according to the fourth embodiment.

In the electronic device 4B illustrated in FIG. 18, a wiring board 10 and a semiconductor package 20 are coupled to each other using a socket 70 including an insulating base 71 and columns 72. The other structural features are similar to those of the electronic device 4A.

The electronic device 4A is assembled similar to the electronic device 1B except that, for example, instead of using the supporting member 40 of the electronic device 1B, the supporting member 100 illustrated in FIG. 18 is used. The supporting member 100 is a one plate member. Therefore, the semiconductor package 20, the socket 70, and the wiring board 10 are secured by coupling the supporting member 100 and a heat-dissipating member 30 to each other with spring provided screws 50. At this time, since the supporting member 100 has a protruding portion 100a facing the wiring board 10, even if a twisting amount of the spring provided screws 50 is non-uniform, a central portion of the wiring board 10 is pushed towards the heat-dissipating member 30 by the protruding portion 100a.

As illustrated in FIG. 18, in the electronic device 4B, the wiring board 10 is supported by the protruding portion 100a of the supporting member 100, and is pushed towards the semiconductor package 20. In FIG. 18, the flat wiring board 10 that is not deformed is illustrated as an example. The wiring board 10 that is deformed is similarly supported by the protruding portion 100a of the supporting member 100.

Even in the electronic device 4B illustrated in FIG. 18, it is similarly possible to reduce the occurrence of defective continuity between the wiring board 10 and the semiconductor package 20, and to effectively maintain electrical connection between the wiring board 10 and the semiconductor package 20.

Here, although, the supporting member 100 is rectangular in plan view, it may be circular. It is desirable that the supporting member 100 be formed of a material having a constant rigidity that does not easily allow it to be deformed when operating or assembling the electronic device 4A or 4B.

Although the exemplary electronic devices 1A to 4A and 1B to 4B are described above, forms of electronic devices to which the supporting members 40, 80, 90, and 100 are applicable are not limited to the above-described exemplary electronic devices 1A to 4A and 1B to 4B.

For example, although, in the aforementioned embodiments, an air-cooling type is used as the type of heat-dissipating member 30, the supporting members 40, 80, 90, and 100 are applicable to the air-cooling type.

Although, in the embodiments, the case in which the supporting members 40, 80, 90, and 100 are coupled to the heat-dissipating members 30 is discussed, the members to which the supporting members 40, 80, 90, and 100 are coupled need not be the heat-dissipating members 30 used for dissipating heat. If the members are those that face the supporting members 40, 80, 90, and 100 with the wiring boards 10 and the semiconductor packages 20 being interposed therebetween (that is, member that cover an upper surface side of the semiconductor packages 20), the members may be used for connection with the supporting members 40, 80, 90, and 100. Even in this case, advantages similar to those provided when the heat-dissipating members 30 are used can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although exemplary implementations of the present inventions have been described in detail, it should be understood that the various changes, substitutions, and alterations could be made hereto without departing from the spirit and scope of the invention.

What is claimed is:

1. An electronic device, comprising:
   a wiring board;
   a semiconductor device arranged at an upper side of the wiring board with an electrically conductive member being arranged therebetween;
   a covering member arranged at an upper side of the semiconductor device; and
   a supporting member arranged at a lower side of the wiring board, the supporting member having a convex portion facing the wiring board, the supporting member being connected to the covering member and supporting the wiring board at the convex portion;
   wherein the supporting member includes a first supporting section and a second supporting section, the first supporting section having the convex portion, the first supporting section being provided at the second supporting section so as to be capable of being raised and lowered.

2. The electronic device according to claim 1, wherein the convex portion has a convex surface configured to be curved in a convex form towards the wiring board.

3. The electronic device according to claim 1, wherein the wiring board is deformable with a portion thereof supported at the convex portion being a fulcrum.

4. The electronic device according to claim 1, wherein the convex portion of the supporting member is situated at an area corresponding to an area where the semiconductor device is arranged.

5. The electronic device according to claim 1, wherein the first supporting section is screwed into the second supporting section, and
wherein a raising and lowering amount of the first supporting section is adjusted by rotating the first supporting section.

6. The electronic device according to claim 1, further comprising:
a connecting member configured to connect the covering member and the supporting member to each other,
wherein one end side of the connecting member is engaged with and stopped by the covering member, and the other end side of the connecting member is coupled to the second supporting section.

7. The electronic device according to claim 1, wherein an entire surface of the supporting member facing the wiring board is a convex surface configured to be curved in a convex form towards the wiring board.

8. The electronic device according to claim 1, wherein the convex portion is a protruding portion provided at a portion of the supporting member in a plane facing the wiring board.

9. The electronic device according to claim 1, further comprising:
a connecting member configured to connect the covering member and the supporting member to each other,
wherein one end side of the connecting member is engaged with and stopped by the covering member, and the other end side of the connecting member is screwed into the supporting member, and
wherein an interval between the covering member and the supporting member is adjusted by rotating the connecting member.

10. The electronic device according to claim 1, wherein the electrically conductive member is a bump.

11. The electronic device according to claim 1, wherein the electrically conductive member is a socket including a supporting base and a column, the column being an electrically conductive resilient body configured to extend through the supporting base and to protrude from both surfaces of the supporting base.

12. A method of producing an electronic device, comprising:
arranging a semiconductor device at an upper side of a wiring board with an electrically conductive member being arranged therebetween;
arranging a covering member at an upper side of the semiconductor device; and
coupling the covering member to a supporting member and supporting the wiring board at a convex portion, the supporting member being arranged at a lower side of the wiring board and having the convex portion facing the wiring board;
wherein the supporting member includes a first supporting section and a second supporting section, the first supporting section having the convex portion, the first supporting section being provided at the second supporting section configured to be capable of being raised and lowered, and
wherein supporting the wiring board at the convex portion includes raising and lowering the first supporting section.

13. The method of producing an electronic device according to claim 12, wherein coupling the coveting member to the supporting member includes coupling the covering member to the second supporting section.

14. The method of producing an electronic device according to claim 12, wherein coupling the covering member to the supporting member includes coupling the covering member to the supporting member with a connecting member having one end side engaged with and stopped by the covering member and the other end side screwed into the supporting member, and
wherein supporting the wiring board at the convex portion includes adjusting an interval between the covering member and the supporting member by rotating the connecting member.

* * * * *